United States Patent
Kim et al.

(10) Patent No.: US 9,922,879 B2
(45) Date of Patent: Mar. 20, 2018

(54) INTEGRATED CIRCUIT DEVICES

(71) Applicant: Samsung Electronics Co., Ltd., Suwon-si, Gyeonggi-do (KR)

(72) Inventors: Weon-hong Kim, Suwon-si (KR); Dong-su Yoo, Hwaseong-si (KR); Min-joo Lee, Seoul (KR); Moon-kyun Song, Anyang-si (KR); Soo-jung Choi, Yangju-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/698,751

(22) Filed: Sep. 8, 2017

(65) Prior Publication Data
US 2017/0372971 A1  Dec. 28, 2017

Related U.S. Application Data

(63) Continuation of application No. 15/152,815, filed on May 12, 2016, now Pat. No. 9,779,996.

(30) Foreign Application Priority Data

Jul. 30, 2015 (KR) ........................ 10-2015-0108149

(51) Int. Cl.
*H01L 21/30* (2006.01)
*H01L 21/8234* (2006.01)
(Continued)

(52) U.S. Cl.
CPC .. *H01L 21/823431* (2013.01); *H01L 21/0214* (2013.01); *H01L 21/0223* (2013.01); *H01L 21/02247* (2013.01); *H01L 21/02332* (2013.01); *H01L 21/28158* (2013.01); *H01L 21/3003* (2013.01); *H01L 21/30604* (2013.01); *H01L 21/31111* (2013.01); *H01L 21/3221* (2013.01); *H01L 21/3247* (2013.01); (Continued)

(58) Field of Classification Search
CPC .......... H01L 21/0223; H01L 21/02255; H01L 21/324; H01L 21/3247; H01L 21/76224; H01L 29/0649
See application file for complete search history.

(56) References Cited

U.S. PATENT DOCUMENTS 5,963,815 A  10/1999  Okamoto et al.
7,282,449 B2  10/2007  Daval et al.
(Continued)

*Primary Examiner* — Jaehwan Oh
(74) *Attorney, Agent, or Firm* — Ward and Smith, P.A.

(57) ABSTRACT

An integrated circuit device may include a gate insulation layer covering a top surface and opposite sidewalls of a fin-shaped active region, a gate electrode covering the gate insulation layer and a hydrogen atomic layer disposed along an interface between the fin-shaped active region and the gate insulation layer. A method of manufacturing the integrated circuit device may include forming an insulating layer covering a lower portion of a preliminary fin-shaped active region, forming a fin-shaped active region having an outer surface with an increased smoothness through annealing an upper portion of the preliminary fin-shaped active region in a hydrogen atmosphere and forming a hydrogen atomic layer covering the outer surface of the fin-shaped active region. A gate insulation layer and a gate electrode may be formed to cover a top surface and opposite sidewalls of the fin-shaped active region.

20 Claims, 26 Drawing Sheets

(51) Int. Cl.
    *H01L 21/311*     (2006.01)
    *H01L 21/28*     (2006.01)
    *H01L 29/66*     (2006.01)
    *H01L 21/322*     (2006.01)
    *H01L 21/324*     (2006.01)
    *H01L 29/06*     (2006.01)
    *H01L 21/76*     (2006.01)
    *H01L 21/306*     (2006.01)
    *H01L 27/088*     (2006.01)
    *H01L 21/02*     (2006.01)

(52) U.S. Cl.
    CPC ...... *H01L 21/76* (2013.01); *H01L 21/823462* (2013.01); *H01L 21/823481* (2013.01); *H01L 27/0886* (2013.01); *H01L 29/0649* (2013.01); *H01L 29/66795* (2013.01); *H01L 21/02252* (2013.01)

(56) References Cited

U.S. PATENT DOCUMENTS

| | | |
|---|---|---|
| 7,288,418 B2 | 10/2007 | Barge et al. |
| 7,749,910 B2 | 7/2010 | Neyret et al. |
| 7,883,628 B2 | 2/2011 | Neyret et al. |
| 7,964,489 B2 | 6/2011 | Koyama et al. |
| 8,624,357 B2 | 1/2014 | Joshi et al. |
| 8,790,970 B2 | 7/2014 | Yeo et al. |
| 8,981,487 B2 | 3/2015 | Hung et al. |
| 2003/0227057 A1 | 12/2003 | Lochtefeld et al. |
| 2006/0157732 A1 | 7/2006 | Von Kaenel et al. |
| 2007/0051299 A1 | 3/2007 | Ong et al. |
| 2007/0054467 A1 | 3/2007 | Currie et al. |
| 2007/0166904 A1 | 7/2007 | Teo et al. |
| 2007/0298549 A1 | 12/2007 | Jurczak et al. |
| 2008/0087890 A1 | 4/2008 | Ahn et al. |
| 2008/0188011 A1 | 8/2008 | Henley |
| 2009/0200604 A1 | 8/2009 | Chidambarrao et al. |
| 2009/0269916 A1 | 10/2009 | Kang et al. |
| 2013/0228832 A1* | 9/2013 | Mieno ................ H01L 29/7851 257/288 |
| 2014/0070360 A1 | 3/2014 | Liu |
| 2014/0206197 A1 | 7/2014 | Nakagawa et al. |
| 2014/0273405 A1 | 9/2014 | Liu et al. |
| 2014/0345829 A1 | 11/2014 | Kang et al. |
| 2014/0353735 A1 | 12/2014 | Basker et al. |
| 2015/0243755 A1* | 8/2015 | Cheng ................ H01L 21/3086 257/288 |
| 2016/0315014 A1* | 10/2016 | Chou ............. H01L 21/823481 |

\* cited by examiner

C - C'

INTEGRATED CIRCUIT DEVICES

CROSS-REFERENCE TO RELATED APPLICATIONS

This present application is a continuation of U.S. patent application Ser. No. 15/152,815, filed May 12, 2016, which claims the benefit of and priority to Korean Patent Application No. 10-2015-0108149, filed Jul. 30, 2015, the disclosures of which are hereby incorporated herein by reference as if set forth in their entireties.

BACKGROUND

Example embodiments of the inventive concepts relate to integrated circuit devices and methods of manufacturing the same, and/or more particularly, to integrated circuit devices including fin-shaped active regions and methods of manufacturing the same.

As an electronic technology is developed, a down-scaling of a semiconductor device has been proceeding rapidly. In recent years, since the semiconductor device needs an accuracy of an operation as well as a high-speed operation, various studies are being conducted for structural optimization of a transistor constituting the semiconductor device.

SUMMARY

Example embodiments of the inventive concepts provide an integrated circuit device that includes a fin-shaped active region with an optimum shape.

Example embodiments of the inventive concepts also provide a method of manufacturing an integrated circuit device that includes a fin-shaped active region with an optimum shape.

According to some example embodiments of the inventive concepts, an integrated circuit device may comprise a fin-shaped active region, a gate insulation layer on a top surface and opposite sidewalls of the fin-shaped active region, a gate electrode situated on the gate insulation layer on the top surface and the opposite sidewalls of the fin-shaped active region and a hydrogen atomic layer situated along an interface between the fin-shaped active region and the gate insulation layer.

A hydrogen atom contained in the hydrogen atomic layer may be combined with a semiconductor element constituting the fin-shaped active region.

The hydrogen atomic layer may comprise a protium atom ($^1$H) and/or a deuterium atom ($^2$H, heavy hydrogen D).

The fin-shaped active region may comprise silicon, and the hydrogen atomic layer may be situated on a surface of the fin-shaped active region in the form of a Si—H bond or a Si-D bond.

The gate insulation layer may comprise a lower gate insulation layer contacting the hydrogen atomic layer, an interface layer on the lower gate insulation layer and a high-k dielectric layer situated on the interface layer and having a dielectric constant greater than a dielectric constant of each of the lower gate insulation layer and the interface layer.

The lower gate insulation layer may comprise silicon oxide, silicon oxynitride or a combination thereof.

The interface layer may comprise silicon oxide, silicon oxynitride or a combination thereof.

The high-k dielectric layer may be situated on a bottom surface and opposite sidewalls of the gate electrode.

According to some example embodiments of the inventive concepts, an integrated circuit device may comprise a substrate having a first region and a second region, a first transistor in the first region and a second transistor in the second region.

The first transistor may comprise a first fin-shaped active region protruding from the substrate, a first gate insulation layer having a first thickness and situated on a top surface and opposite sidewalls of the first fin-shaped active region, a first gate electrode situated on the first gate insulation layer on the top surface and the opposite sidewalls of the first fin-shaped active region and a hydrogen atomic layer situated along an interface between the first fin-shaped active region and the first gate insulation layer.

The second transistor may comprise a second fin-shaped active region protruding from the substrate, a second gate insulation layer having a second thickness different from the first thickness and situated on a top surface and opposite sidewalls of the second fin-shaped active region and a second gate electrode situated on the second gate insulation layer on the top surface and the opposite sidewalls of the second fin-shaped active region.

The hydrogen atomic layer may comprise a protium atom ($^1$H) and/or a deuterium atom ($^2$H, heavy hydrogen D).

The hydrogen atomic layer may be situated on a surface of the first fin-shaped active region in the form of a Si—H bond or a Si-D bond.

A width of the first gate electrode along a longitudinal direction of the first fin-shaped active region may be greater than a width of the second gate electrode along a longitudinal direction of the second fin-shaped active region.

The first gate insulation layer may comprise a lower gate insulation layer contacting the hydrogen atomic layer, a first interface layer on the lower gate insulation layer and a first high-k dielectric layer situated on the first interface layer and having a dielectric constant greater than a dielectric constant of each of the lower gate insulation layer and the first interface layer, and the second gate insulation layer may comprise a second interface layer contacting the second fin-shaped active region and a second high-k dielectric layer situated on the second interface layer and having a dielectric constant greater than a dielectric constant of the second interface layer.

The lower gate insulation layer may comprise silicon oxide, silicon oxynitride or a combination thereof.

The first high-k dielectric layer may be situated on a bottom surface and opposite sidewalls of the first gate electrode, and the second high-k dielectric layer may be situated on a bottom surface and opposite sidewalls of the second gate electrode.

According to some example embodiments of the inventive concepts, a method of manufacturing an integrated circuit device may comprise forming a preliminary fin-shaped active region by partially etching a substrate, forming an insulating layer covering a lower portion of the preliminary fin-shaped active region such that an upper portion of the preliminary fin-shaped active region protrudes above the insulating layer, forming a fin-shaped active region and a hydrogen atomic layer through annealing the protruding portion of the preliminary fin-shaped active region in a hydrogen atmosphere, the fin-shaped active region having a surface with a smoothness greater than a smoothness of a surface of the preliminary fin-shaped active region and the hydrogen atomic layer covering the surface of the fin-shaped active region, forming a gate insulation layer on the hydrogen atomic layer to cover a top surface and opposite sidewalls of the fin-shaped active region and forming a gate electrode on the gate insulation layer to cover the top surface and the opposite sidewalls of the fin-shaped active region.

The forming of the fin-shaped active region and the hydrogen atomic layer may be performed such that the fin-shaped active region has the surface terminated with hydrogen atoms constituting the hydrogen atomic layer.

The forming of the fin-shaped active region may comprise changing morphology of a surface of the protruding portion of the preliminary fin-shaped active region during the annealing in the hydrogen atmosphere.

The forming of the fin-shaped active region may comprise reducing a roughness of a surface of the protruding portion of the preliminary fin-shaped active region through a hydrogen-enhanced surface atom migration on the surface of the protruding portion of the preliminary fin-shaped active region during the annealing in the hydrogen atmosphere.

The forming of the fin-shaped active region may further comprise removing contaminants from a surface of the protruding portion of the preliminary fin-shaped active region using the annealing in the hydrogen atmosphere.

The forming of the gate insulation layer may comprise forming a lower gate insulation layer contacting the hydrogen atomic layer, and the forming of the lower gate insulation layer may comprise forming an oxide layer on the hydrogen atomic layer by a first oxidation treatment using a plasma and increasing a thickness of the oxide layer by a second oxidation treatment that does not use a plasma in a state in which the hydrogen atomic layer is covered with the oxide layer.

The forming of the oxide layer may be performed in a plasma atmosphere using an oxygen ($O_2$) gas and an inert gas.

The forming of the oxide layer may be performed in a plasma atmosphere using an oxygen ($O_2$) gas, an inert gas and a hydrogen ($H_2$) gas.

The increasing of the thickness of the oxide layer may comprise performing an in-situ stream generation (ISSG) process using steam, or a combination of a hydrogen ($H_2$) gas and an oxygen ($O_2$) gas.

The method may further comprise, after the forming an oxide layer, prior to the increasing a thickness of the oxide layer, decreasing the thickness of the oxide layer by partially removing the oxide layer without any exposure of the fin-shaped active region disposed thereunder.

The decreasing of the thickness of the oxide layer may be performed using a wet etch process.

The forming of the lower gate insulation layer may comprise forming a silicon oxynitride layer by nitriding at least a portion of the oxide layer.

The nitriding at least a portion of the oxide layer may be performed after the increasing a thickness of the oxide layer.

The nitriding at least a portion of the oxide layer may be performed using a decoupled plasma nitridation (DPN) process.

The forming of the gate insulation layer further may comprise forming an interface layer covering the lower gate insulation layer and forming a high-k dielectric layer disposed on the interface layer and having a dielectric constant greater than a dielectric constant of each of the lower gate insulation layer and the interface layer.

According to some example embodiments of the inventive concepts, a method of manufacturing an integrated circuit device may comprise forming first and second preliminary fin-shaped active regions protruding in first and second regions of a substrate, respectively, by partially etching the substrate, forming an insulating layer covering respective lower portions of the first and second preliminary fin-shaped active regions such that respective upper portions of the first and second preliminary fin-shaped active regions protrudes above the insulating layer, forming a first fin-shaped active region having a surface with a smoothness greater than a smoothness of a surface of the first preliminary fin-shaped active region in the first region and a second fin-shaped active region having a surface with a smoothness greater than a smoothness of a surface of the second preliminary fin-shaped active region in the second region through annealing the respective protruding portions of the first and second preliminary fin-shaped active regions in a hydrogen atmosphere, after the annealing in the hydrogen atmosphere, without a wet process, forming a first lower gate insulation layer covering a top surface and opposite sidewalls of the first fin-shaped active region in the first region and a second lower gate insulation layer covering a top surface and opposite sidewalls of the second fin-shaped active region in the second region, exposing an upper portion of the second fin-shaped active region by removing the second lower gate insulation layer in the second region and forming a first high-k dielectric layer on the first lower gate insulation layer in the first region and a second high-k dielectric layer on the second fin-shaped active region in the second region.

The forming of the first and second fin-shaped active regions may comprise forming a hydrogen atomic layer covering respective surfaces of the first and second fin-shaped active regions during the annealing in the hydrogen atmosphere.

Each of the first and second fin-shaped active regions may be formed to have a surface that is terminated with hydrogen atoms constituting the hydrogen atomic layer.

The method may further comprise reducing a roughness of a surface of the protruding portion of each of the first and second preliminary fin-shaped active regions through a hydrogen-enhanced surface atom migration on the surface of the protruding portion of each of the first and second preliminary fin-shaped active regions during the annealing in the hydrogen atmosphere.

The forming of the first and second lower gate insulation layers may comprise forming an oxide layer on the first and second fin-shaped active regions by a first oxidation treatment using a plasma in the first and second regions and increasing a thickness of the oxide layer by a second oxidation treatment that does not use a plasma in the first and second regions.

The method may further comprise, after the forming an oxide layer, prior to the increasing a thickness of the oxide layer, decreasing the thickness of the oxide layer by wet-etching the oxide layer in the first and second regions, and the increasing of the thickness of the oxide layer may comprise increasing the decreased thickness of the oxide layer.

The method may further comprise, after the increasing a thickness of the oxide layer, forming a silicon oxynitride layer by nitriding at least a portion of the oxide layer in the first and second regions through a decoupled plasma nitridation (DPN) process.

BRIEF DESCRIPTION OF THE DRAWINGS

Example embodiments of the inventive concepts will be more clearly understood from the following detailed description taken in conjunction with the accompanying drawings. FIGS. 1 through 10 represent non-limiting, example embodiments as described herein.

FIG. 1 is a cross-sectional view illustrating a portion of an integrated circuit device according to some embodiments of the present inventive concepts.

FIG. 4 illustrates a block diagram of an integrated circuit device according to some embodiments of the inventive concepts.

FIG. 5 is a cross-sectional view illustrating essential parts of an integrated circuit device according to some embodiments of the inventive concepts.

FIG. 8 is a cross-sectional view illustrating a portion of an integrated circuit device according to some embodiments of the inventive concepts.

FIG. 9 is a cross-sectional view illustrating essential parts of an integrated circuit device according to some embodiments of the inventive concepts.

FIG. 10 illustrates a block diagram of an electronic system according to some embodiments of the inventive concepts.

DETAILED DESCRIPTION OF EXAMPLE EMBODIMENTS

Figure 1:
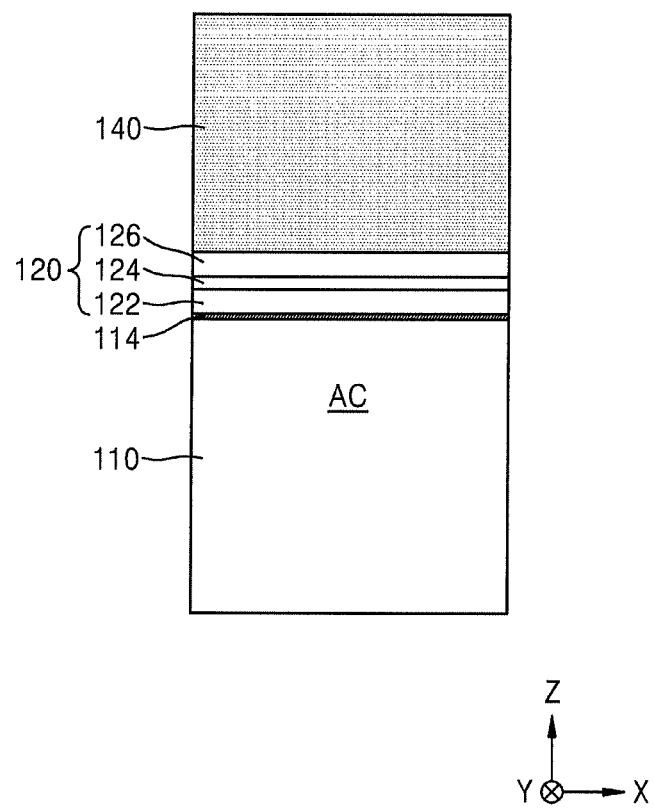

Hereinafter, example embodiments of the inventive concepts will be described with reference to the accompanying drawings. The inventive concepts may, however, be embodied in many different forms and should not be construed as being limited to the embodiments set forth herein; rather, these example embodiments are provided so that this disclosure will be thorough and complete, and will fully convey the inventive concepts to those of ordinary skill in the art. It should be understood, however, that there is no intent to limit the inventive concepts to the particular forms disclosed, but on the contrary, the inventive concepts are to cover all modifications, equivalents, and alternatives falling within the spirit and scope of the inventive concepts. Like reference numerals denote like elements throughout the specification and drawings. In the drawings, the dimensions of structures are exaggerated or reduced for clarity of the inventive concepts.

Also, though terms "first" and "second" are used to describe various members, components, regions, layers, and/or portions in various embodiments of the inventive concepts, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Unless otherwise defined, all terms used herein, including technical and scientific terms, have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list. The term "a hydrogen molecule" may be the generic name for a protium molecule ($H_2$) and a deuterium molecule ($D_2$) and the term "hydrogen" may be used as a generic name for protium (H) and deuterium (D).

As in the following, a method of manufacturing an integrated circuit device according to example embodiments of the inventive concepts will be described in detail with reference to FIGS. 1 through 10.

FIG. 1 is a cross-sectional view illustrating an essential part of an integrated circuit device 100 according to example embodiments of the inventive concepts.

Referring to FIG. 1, the integrated circuit device 100 may include a substrate 110 having an active region AC, a gate insulation layer 120 that is formed on the active region AC, a gate electrode 140 that is formed on the gate insulation layer 120, and a hydrogen atomic layer 114 that is formed along an interface between the active region AC and the gate insulation layer 120.

The gate insulation layer 120 may include a lower gate insulation layer 122 that contacts the hydrogen atomic layer 114, an interface layer 124 that is formed on the lower gate insulation layer 122 and a high-k dielectric layer 126 that is formed on the interface layer 124 and has a dielectric constant greater than a dielectric constant of each of the lower gate insulation layer 122 and the interface layer 124.

The substrate 110 may include a semiconductor (e.g., Si or Ge) or a compound semiconductor (e.g., SiGe, SiC, GaAs, InAs or InP). In some example embodiments, the substrate 110 may include a III-V group material, a IV group material or a combination thereof. The III-V group material may be a binary compound, a ternary compound or a quarternary compound, each of which contains at least one III group element and at least one V group element. The III-V group material may be a compound including at least one element of indium (In), gallium (Ga), and aluminum (Al) as a III group element and at least one element of arsenic (As), phosphorus (P), and antimonium (Sb) as a V group element. For example, the III-V group material may include InP, $In_zGa_{1-z}As$ ($0 \leq z \leq 1$) or $Al_zGa_{1-z}As$ ($0 \leq z \leq 1$). The binary compound may include, for example, InP, GaAs, InAs, InSb, GaSb or a combination thereof. The ternary compound may include InGaP, InGaAs, AlInAs, InGaSb, GaAsSb, GaAsP or a combination thereof. The IV group material may include silicon (Si) or germanium (Ge). But, the III-V group material and the IV group material available to an integrated circuit device according to some example embodiments of the inventive concepts are not limited thereto. The III-V group material and the IV group material (e.g., Ge) may be used as a channel material for a low-power and high-speed transistor. By using a semiconductor substrate comprising a III-V group material (e.g., GaAs) having an electron mobility greater than that of a silicon (Si) substrate and a semiconductor substrate comprising a semiconductor material (e.g., Ge) having a hole mobility greater than that of the silicon (Si) substrate, a high-performance CMOS device may be formed. In some example embodiment, when an NMOS transistor is formed on the substrate 110, the substrate 110 may include one of the III-V group material described above. In some example embodiments, when a PMOS transistor is formed on the substrate 110, at least a portion of the substrate 110 may include Ge. In some example embodiments, the substrate 110 may have a silicon-on-insulator (SOI) structure. The substrate 110 may include a conductive region, for example, an impurity-doped well or an impurity-doped structure.

A hydrogen atom contained in the hydrogen atomic layer 114 may be combined with a semiconductor element constituting the active region AC. In some example embodiments, the hydrogen atomic layer 114 may include a $^1$H (H) atom (i.e., a protium atom) or a $^2$H (D) atom (i.e., a heavy hydrogen or deuterium atom).

In some example embodiments, the active region is formed of silicon, and a hydrogen atom constituting the hydrogen atomic layer 114 may be disposed on a surface of the active region AC in the form of a Si—H bond or a Si-D bond.

Figure 2A:
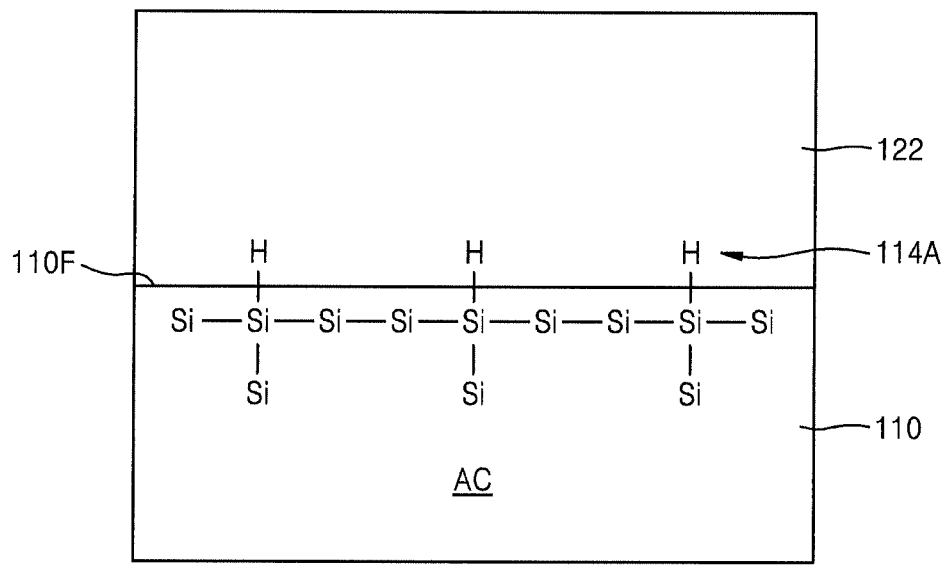
FIGS. 2A and 2B illustrate enlarged views of some configurations including a hydrogen atomic layer of an integrated circuit device according to some embodiments of the inventive concepts.
Figure 2B:
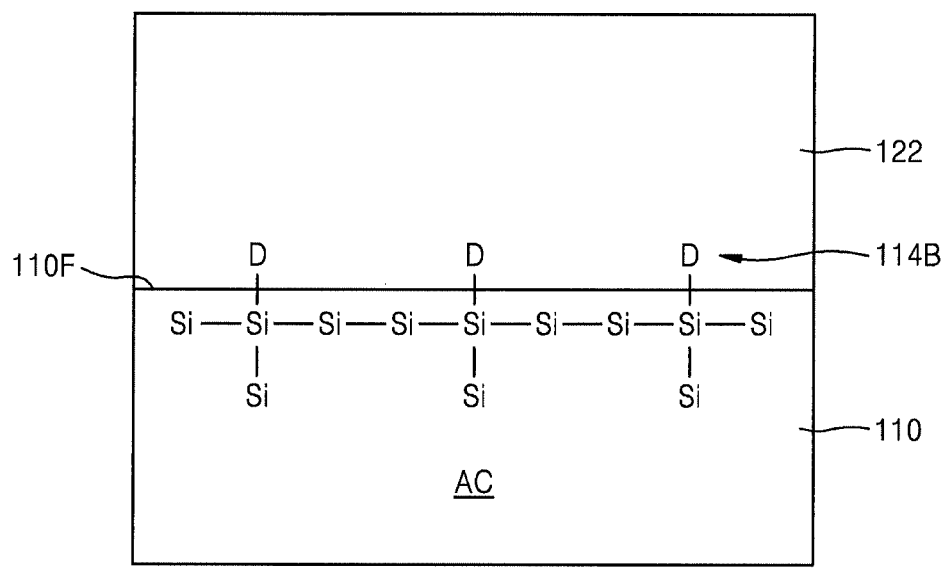

FIGS. 2A and 2B are enlarged views of some configurations of the integrated circuit device 100 described in FIG. 1 for illustrating hydrogen atomic layers 114A and 114B disposed along an interface 110F between the active region AC and the lower gate insulation layer 122 (i.e., on a surface of the active region AC of the substrate 110 including Si).

FIG. 2A illustrates a case where the hydrogen atomic layer 114A includes a $^1$H (H) atom. FIG. 2B illustrates a case where the hydrogen atomic layer 114B includes a $^2$H (D) atom. One of the hydrogen atomic layers 114A and 114B illustrated in FIGS. 2A and 2B may constitute the hydrogen atomic layer 114 illustrated in FIG. 1.

H atoms or D atoms contained in the hydrogen atomic layers 114A and 114B illustrated in FIGS. 2A and 2B may be present in the form of a Si—H bond or a Si-D bond at an interface between the active region AC of the substrate 110 and the lower gate insulation layer 122 to reduce dangling bonds at the interface therebetween. The hydrogen atomic layers 114A and 114B may serve to passivate a surface of the active region AC of the substrate 110.

The hydrogen atomic layers 114A and 114B may be formed by annealing the surface of the active region AC of the substrate 110 in a hydrogen atmosphere or in a heavy hydrogen atmosphere.

Specific details of a formation process of the hydrogen atomic layers 114A and 114B are substantially the same as those of a formation process of the hydrogen atomic layer 114 in FIG. 7.

Referring back to FIG. 1, the lower gate insulation layer 122 may include a silicon oxide layer, a silicon oxynitride layer or a combination thereof. The lower gate insulation layer 122 may have a thickness ranging from 10 Å to 40 Å, but it is not limited thereto.

The interface layer 124 may be formed of a low-k dielectric material layer having a dielectric constant equal to or less than 9 (e.g., ranging from 1 to 9). For example, the interface layer 124 may include a silicon oxide layer, a silicon oxynitride layer or a combination thereof. The interface layer 124 may have a thickness ranging from 5 Å to 20 Å, but it is not limited thereto.

The high-k dielectric layer 126 may be formed of a material having a dielectric constant greater than a dielectric constant of each of the lower gate insulation layer 122 and the interface layer 124. For example, the high-k dielectric layer 126 may have a dielectric constant ranging from 10 to 25.

In some example embodiments, the high-k dielectric layer 126 may include hafnium oxide, hafnium oxynitride, hafnium silicon oxide, lanthanum oxide, lanthanum aluminium oxide, zirconium oxide, zirconium silicon oxide, tantalum oxide, tantalum silicon oxide, titanium oxide, barium strontium titanium oxide, barium titanium oxide, strontium titanium oxide, yttrium oxide, erbium oxide, dysprosium oxide, gadolinium oxide, aluminium oxide, lead scandium tantalum oxide, lead zinc niobate or a combination thereof, but it is not limited thereto.

The high-k dielectric layer 126 may be formed through an atomic layer deposition (ALD) process, a chemical vapour deposition (CVD) process or a physical vapour deposition (PVD) process. The high-k dielectric layer 126 may have a thickness ranging from 10 Å to 40 Å, but it is not limited thereto.

The gate electrode 140 may include a metal-containing layer for adjusting a work function and a gap-filling metal-containing layer on the metal-containing layer for adjusting a work function. In some example embodiments, the gate electrode 140 may include a structure in which a metal nitride layer, a metal layer, a conductive capping layer, and a gap-filling metal layer are sequentially stacked. The metal nitride layer and the metal layer may each include titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), lead (Pb) or a combination thereof. Each of the metal nitride layer and the metal layer may be formed through an ALD process, a metal organic ALD process or a metal organic CVD process. The conductive capping layer may act as a protective layer for preventing a surface of the metal layer from oxidizing. Furthermore, the conductive capping layer may act as a wetting layer for easily depositing another conductive layer on the metal layer. The conductive capping layer may include a metal nitride, for example, TiN, TaN or a combination thereof, but it is not limited thereto. The gap-filling metal layer may extend over the conductive capping layer. The gap-filling metal layer may include a tungsten layer. The gap-filling metal layer may be formed through an ALD process, a CVD process or a PVD process. The gap-filling metal layer may completely fill a recess region delimited by a step portion of a surface of the conductive capping layer without an undesirable void. In some example embodiments, the gate electrode 140 may include a stacked structure of TiAlC/TiN/W, a stacked structure of TiN/TaN/TiAlC/W or a stacked structure of TiN/TaN/TiN/TiAlC/W. In the stacked structures, the TiAlC layer or the TiN layer may act as the metal-containing layer for adjusting a work function.

Figure 3A:
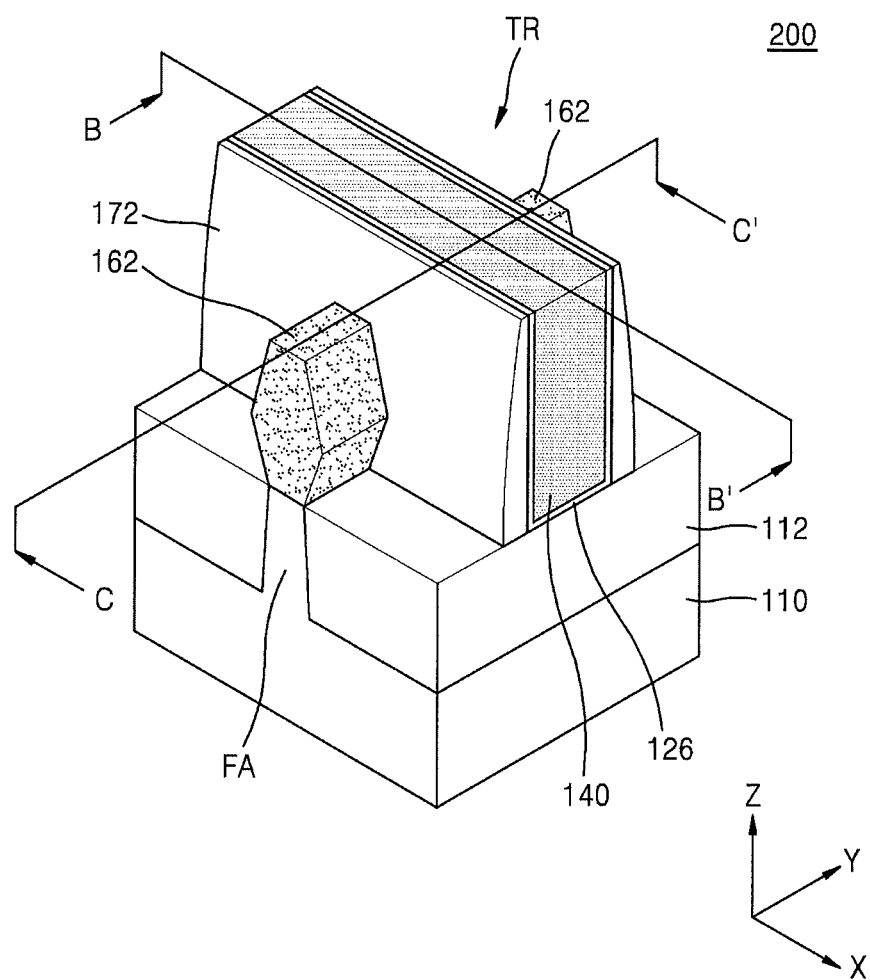
FIG. 3A is a perspective view illustrating a portion of the integrated circuit device including a fin field effect transistor (FET) in accordance with some embodiments of the present inventive concept.
Figure 3B:
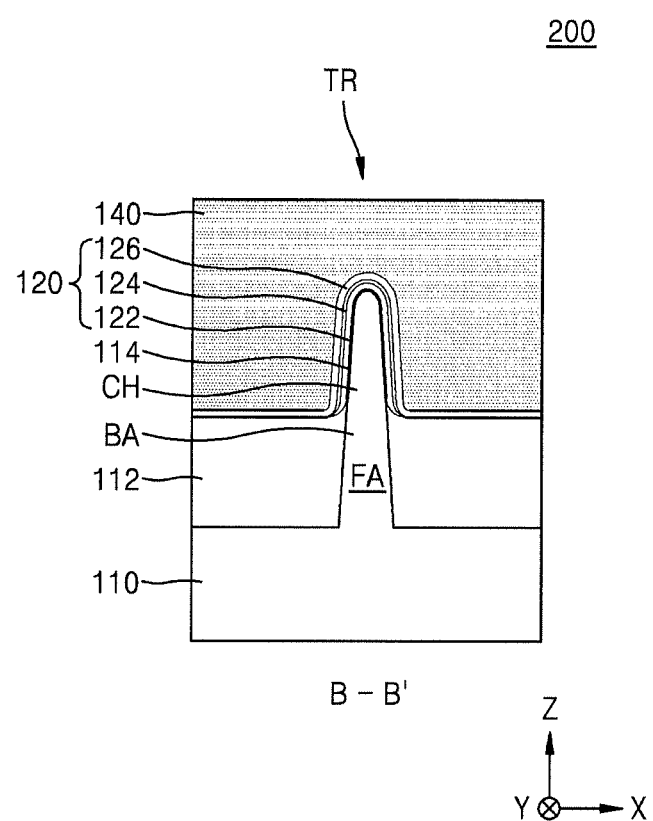
FIG. 3B is a cross-sectional view taken along a line B-B' of FIG. 3A.
Figure 3C:
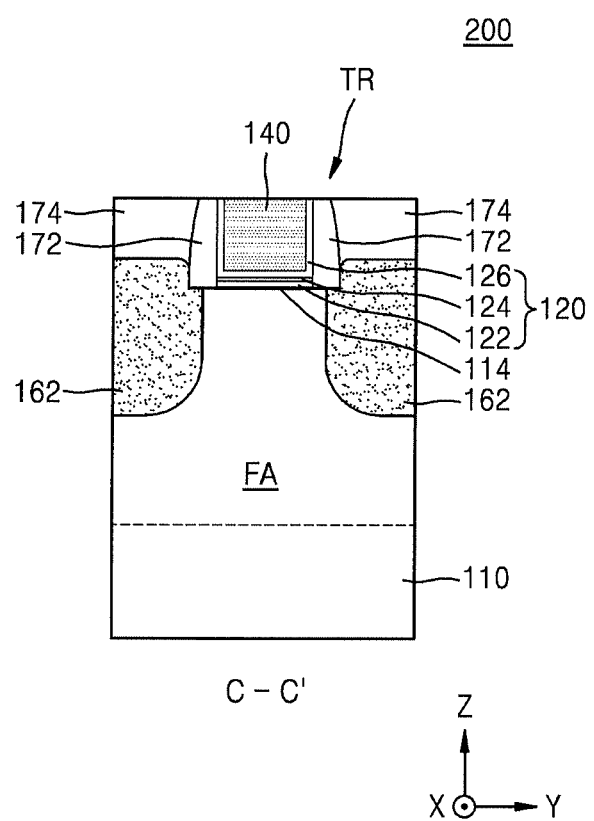
FIG. 3C is a cross-sectional view take along a line C-C' of FIG. 3A.

FIGS. 3A through 3C are views illustrating an integrated circuit device 200 according to example embodiments of the inventive concepts. FIG. 3A is a perspective view illustrating essential parts of the integrated circuit device including a transistor TR having a fin field effect transistor (FinFET). FIG. 3B is a cross-sectional view taken along a line B-B' of FIG. 3A. FIG. 3C is a cross-sectional view take along a line C-C' of FIG. 3A. In FIGS. 3A through 3C, the same reference numerals as those illustrated in FIG. 1 denote the same elements and a discussion thereof will not be given.

The integrated circuit device 200 may include a fin-shaped active region FA protruding from a substrate 110 along a direction (Z direction) perpendicular to a main surface of the substrate 110. The fin-shaped active region FA may extend along a direction (e.g., Y direction in FIGS. 3A through 3C). A device isolation layer 112 may be disposed on or in the substrate 110 so as to cover a lower portion of the fin-shaped active region FA (i.e., lower sidewalls of the fin-shaped active region FA). The fin-shaped active region FA may protrude above the device isolation layer 112 in the form of a fin.

The fin-shaped active region FA may include a base region BA and a channel region CH on the base region BA. The base region BA and the channel region CH may be connected to each other. Opposite sidewalls of the base region BA may be covered with the device isolation layer 112.

In some example embodiments, the channel region CH of the fin-shaped active region FA may be formed of a single material. For example, the whole region of the fin-shaped active region FA including the channel region CH may be formed of Si. In some example embodiments, a portion of the fin-shaped active region FA may be formed of Ge and another portion thereof may be formed of Si.

A gate insulation layer 120 may be formed to cover a top surface and opposite sidewalls of the fin-shaped active region FA. A hydrogen atomic layer 114 may be formed along an interface between the top surface and the opposite sidewalls of the fin-shaped active region FA and a lower gate insulation layer 122. A gate electrode 140 may be formed to cover the gate insulation layer 120 on the top surface and the opposite sidewalls of the fin-shaped active region FA.

Similarly to the hydrogen atomic layers 114A and 114B illustrated with reference to FIGS. 2A and 2B, a hydrogen atom constituting the hydrogen atomic layer 114 may be combined with a semiconductor element constituting the fin-shaped active region FA. For example, the fin-shaped active region FA may be formed of Si, and an H atom or a D atom constituting the hydrogen atomic layer 114 may be present in the form of a Si—H bond or a Si-D bond on the surface of the fin-shaped active region FA.

As illustrated in FIG. 3C, the hydrogen atomic layer 114, the lower gate insulation layer 122 and an interface layer 124 of the integrated circuit device 200 may be formed between the top surface and the opposite sidewalls of the fin-shaped active region FA and a bottom surface of the gate electrode 140, and may face the bottom surface of the gate electrode 140. A high-k dielectric layer 126 may be formed to face the bottom surface and opposite sidewalls of the gate electrode 140.

The device isolation layer 112 may include a silicon-containing insulating layer (e.g., a silicon oxide layer, a silicon nitride layer, a silicon oxynitride layer or a silicon carbon nitride layer), poly-silicon or a combination thereof.

A pair of source/drain regions 162 may be formed in the fin-shaped active region FA at opposite sides of the gate electrode 140. The pair of source/drain regions 162 may a semiconductor layer epitaxially grown from the fin-shaped active region FA. The source/drain region 162 may include an embedded SiGe structure having a plurality of epitaxially-grown SiGe layers, an epitaxially-grown Si layer or an epitaxially-grown SiC layer.

FIGS. 3A and 3C illustrate a case where the pair of the source/drain regions 162 has a specific shape, but it is not limited thereto. The source/drain regions 162 may have various cross-sectional shapes.

A transistor TR may be formed in a portion at which the fin-shaped active region FA and the gate electrode 140 intersect each other. The transistor TR may be a MOS transistor having a three dimensional structure in which a channel is formed at the top surface and the opposite sidewalls of the fin-shaped active region FA. The MOS transistor may constitute an NMOS transistor or a PMOS transistor.

An insulating spacer 172 may be formed at opposite sidewalls of the gate structure including the hydrogen atomic layer 114, the gate insulation layer 120 and the gate electrode 140 sequentially stacked from the surface of the fin-shaped active region FA. As illustrated in FIG. 3C, an insulating layer 174 may be formed to cover a sidewall of the insulating spacer 172 that does not face the gate structure. The insulating spacer 172 may be formed of silicon nitride and the insulating layer 174 may be formed of silicon oxide, but it is not limited thereto.

Figure 4:
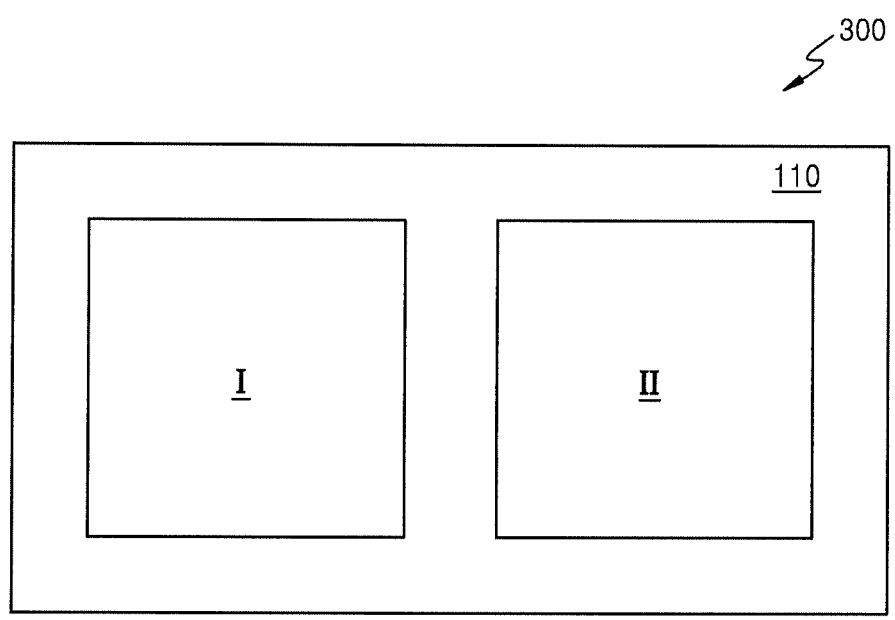

FIG. 4 illustrates a block diagram of an integrated circuit device 300 according to example embodiments of the inventive concepts. In FIG. 4, the same reference numerals as those illustrated in FIG. 1 denote the same elements and a discussion thereof will not be given.

Referring to FIG. 4, the integrated circuit device 300 may include a first region I and a second region II.

The first region I and the second region II may be regions in which different functions are performed on a same substrate 110. The first region I and the second region II may be spaced apart from each other or may be connected to each other.

In some example embodiments, the first region I may be a high voltage region for forming a high voltage transistor to which a relatively high operating voltage is applied and the second region II may be a low voltage region for forming a low voltage transistor to which a relatively low operating voltage is applied. For example, the high voltage transistor may have an operating voltage equal to or greater than 1 volt, and the low voltage transistor may have an operating voltage less than 1 volt.

The first region I may be a region for forming a transistor having a high reliability, even though a threshold voltage thereof is relatively high and a switching speed thereof is not faster. In some example embodiments, the first region I may be a peripheral circuit region including peripheral circuits inputting external data to the internal circuitry of the integrated circuit device 200 or outputting data from the internal circuitry of the integrated circuit device 200 to the outside. In some example embodiments, the first region I may constitute a part of an input/output (I/O) circuit device.

The second region II may be a region for forming a transistor having a relatively low threshold voltage and a high switching speed. In some example embodiments, the second region II may be a cell array region in which multiple unit memory cells are arranged in a matrix form. For example, the second region II may be a logic cell region or a memory cell region. The logic region may include various types of logic cells as standard cells performing a desired logic function such as a counter or a buffer. The logic cell may constitute, for example, AND, NAND, OR, NOR, XOR (exclusive OR), XNOR (exclusive NOR), INV (inverter), ADD (adder), BUF (buffer), DLY (delay), FILL (filter), multiplexer (MXT/MXIT), OAI (OR/AND/INVERTER), AO (AND/OR), AOI (AND/OR/INVERTER), delay flip-flop, reset flip-flop, master-slaver flip-flop or latch, but it is not limited thereto. The memory cell region may include a SRAM cell region, a DRAM cell region, a MRAM cell region, a RRAM cell region, a PRAM cell region or a combination thereof.

Figure 5:
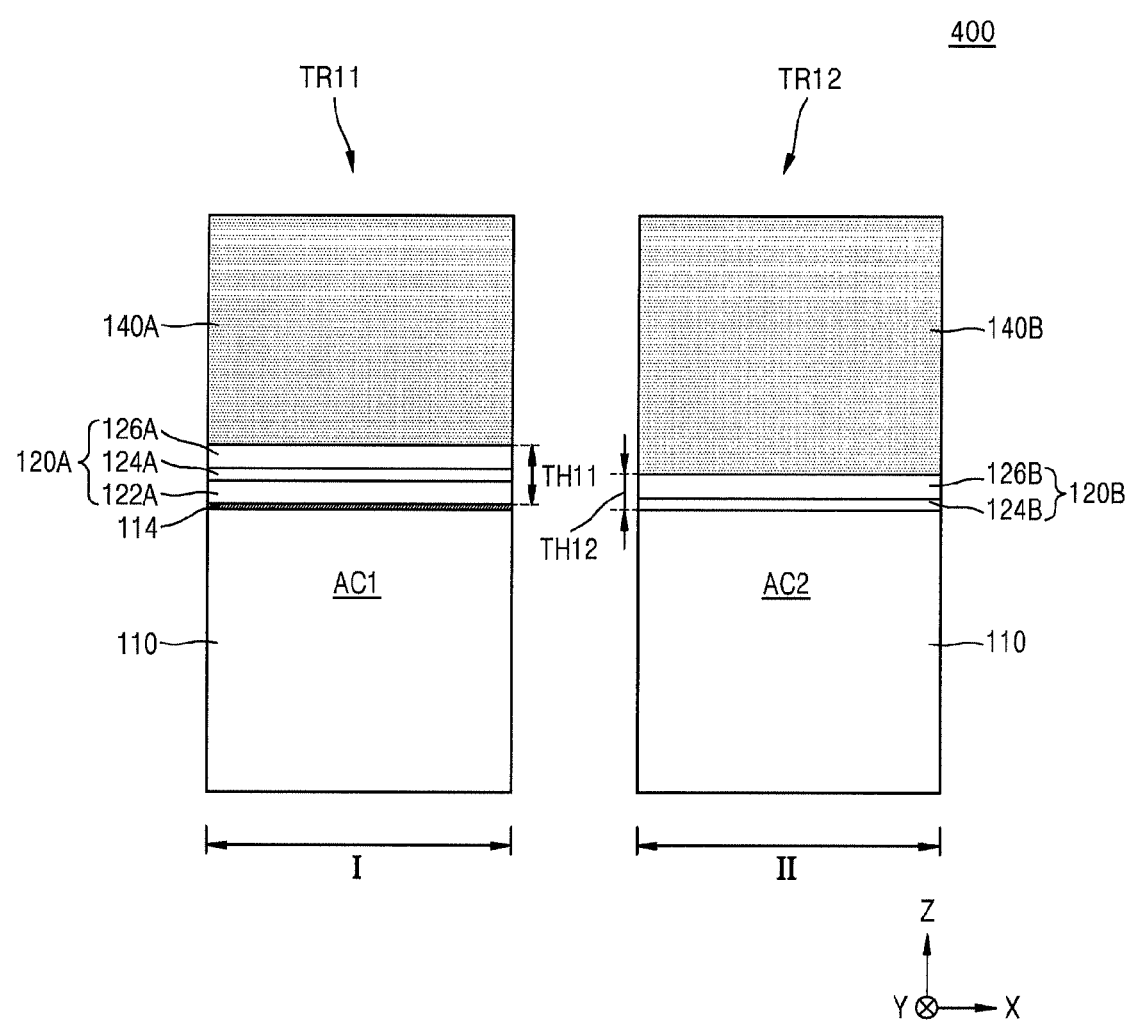

FIG. 5 is a cross-sectional view illustrating essential parts of an integrated circuit device 400 according to example embodiments of the inventive concepts. In FIG. 5, the same reference numerals as those illustrated in FIG. 1 through 4 denote the same elements and a discussion thereof will not be given.

Referring to FIG. 5, the integrated circuit device 400 may include a substrate 110 that has a first region I and a second region II, a first transistor TR11 that is formed in the first region I, and a second transistor TR12 that is formed in the second region II.

The first transistor TR11 in the first region I may include a first gate insulation layer 120A having a lower gate insulation layer 122A, a first interface layer 124A and a first high-k dielectric layer 126A that are sequentially formed on a first active region AC1 of the substrate 110, and a first gate electrode 140A. Furthermore, a hydrogen atomic layer 114 may be formed along an interface between the first active region AC1 and the first gate insulation layer 120A. Similarly to the hydrogen atomic layer 114A illustrated with reference to FIG. 2A, hydrogen atoms contained in the hydrogen atomic layer 114 may be present in the form of a Si—H bond on a surface of the first active region AC1, or similarly to the hydrogen atomic layer 114B illustrated with reference to FIG. 2B, hydrogen atoms contained in the hydrogen atomic layer 114 may be present in the form of a Si-D bond on a surface of the first active region AC1.

The first gate insulation layer 120A may have a first thickness TH11. Specific details of the first interfacial layer 124A and the first high-k dielectric layer 126A constituting the first gate insulation layer 120A, and the first gate electrode 140A are substantially the same as those of the interfacial layer 124 and the high-k dielectric layer 126 constituting the gate insulation layer 120, and the gate electrode 140 described with reference to FIG. 1.

The second transistor TR12 in the second region II may include a second gate insulation layer 120B having a second interface layer 124B and a second high-k dielectric layer 126B that are sequentially formed on a second active region AC2 of the substrate 110, and a second gate electrode 140B that covers the second gate insulation layer 120B.

The second interface layer 124B, the second high-k dielectric layer 126B and the second gate electrode 140B may have substantially the same configurations as those of the interface layer 124, the high-k dielectric layer 126 and the gate electrode 140 illustrated with reference to FIG. 1, respectively. The second gate insulation layer 120B may have substantially the same configuration as that of the first gate insulation layer 120A, except that the second gate insulation layer 120B does not include the hydrogen atomic layer 114 and the lower gate insulation layer 122A. The second gate insulation layer 120B may have a second thickness TH12 less than the first thickness TH11.

Figure 6A:
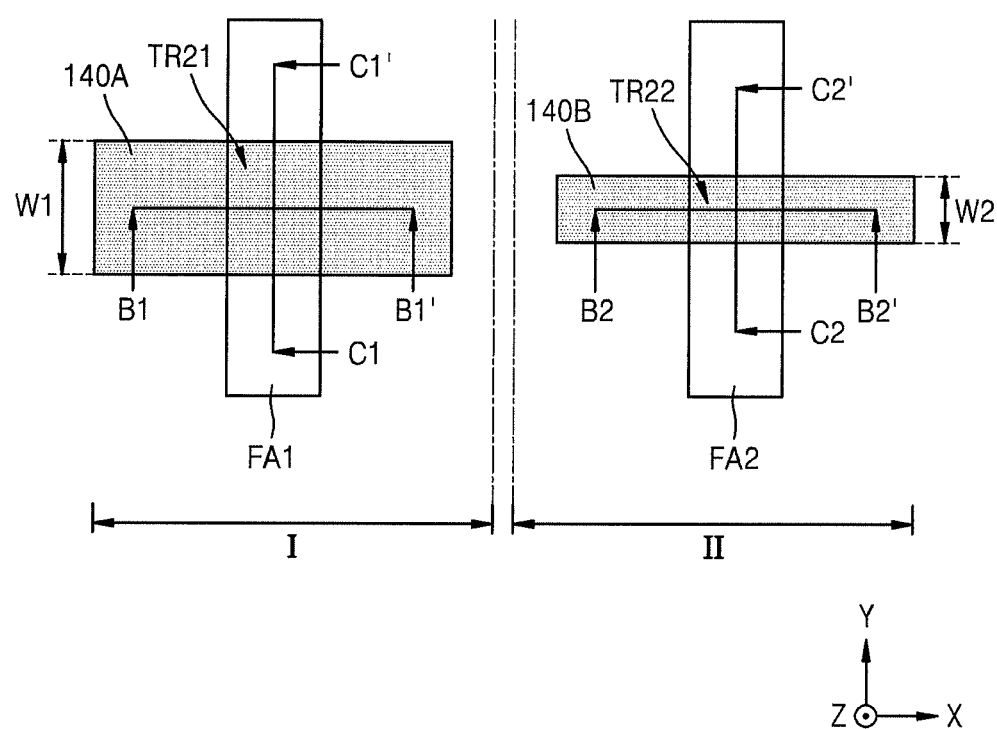
FIG. 6A is a plan view illustrating essential parts of an integrated circuit device according to some embodiments of the inventive concepts.
Figure 6B:
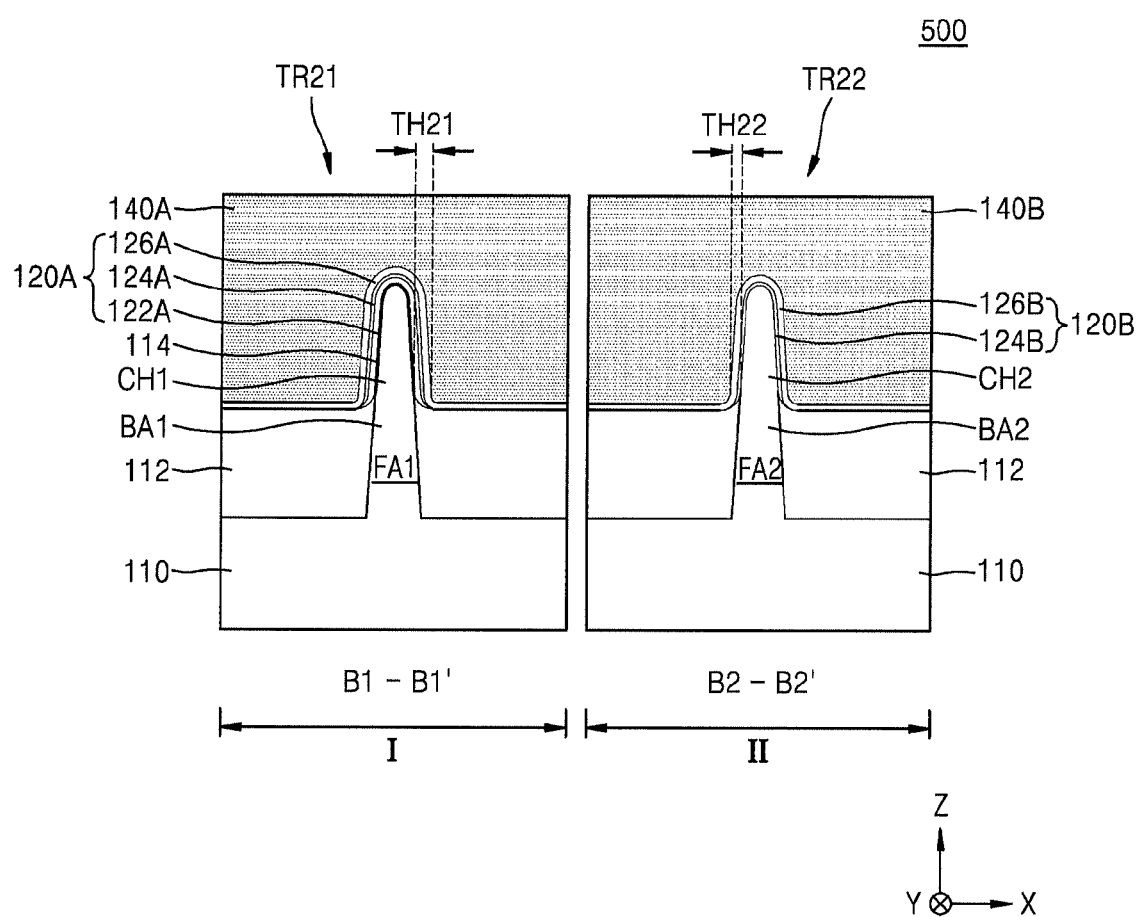
FIG. 6B is a cross-sectional view illustrating sectional configurations of lines B1-B1' and B2-B2' of FIG. 6A.
Figure 6C:
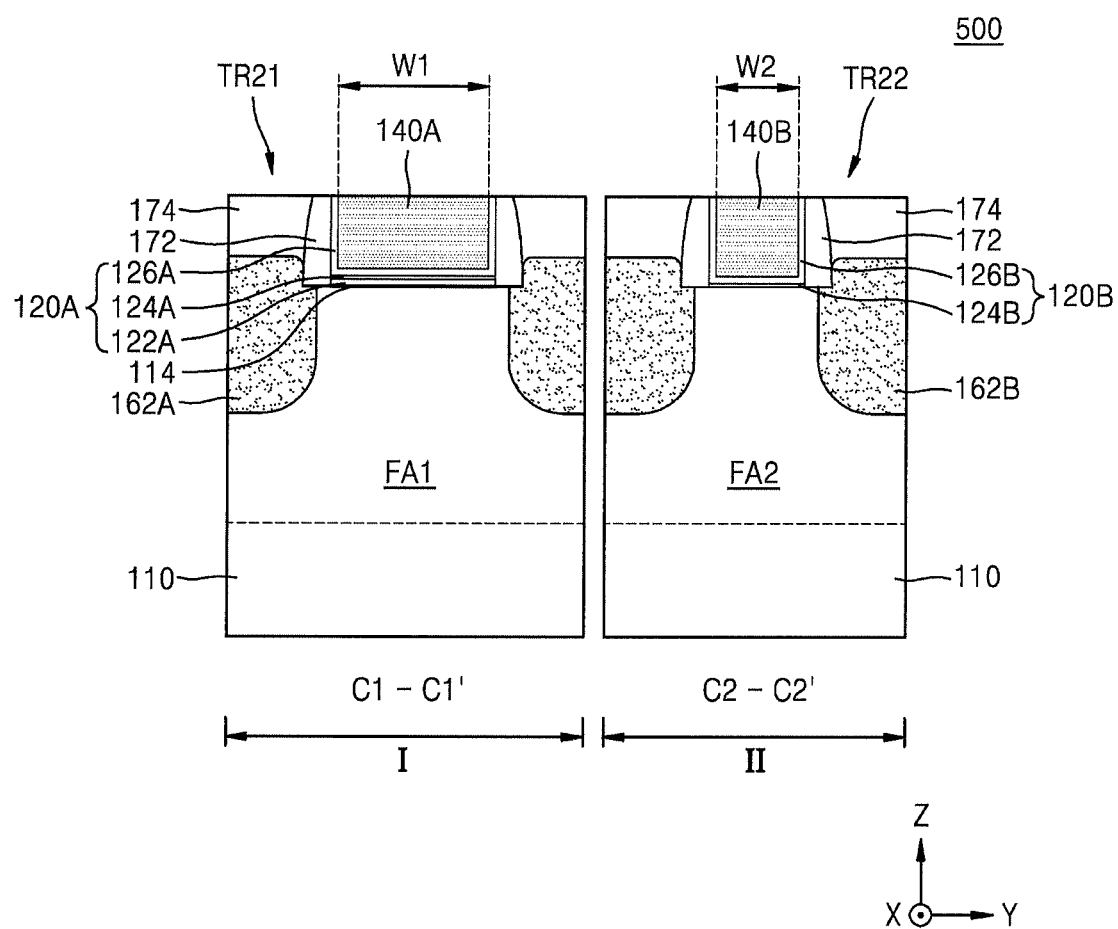
FIG. 6C is a cross-sectional view illustrating sectional configurations of lines C1-C1' and C2-C2' of FIG. 6A.

FIG. 6A is a plan view illustrating essential parts of an integrated circuit device 500 according to example embodiments of the inventive concepts. FIG. 6B is a cross-sectional view illustrating sectional configurations of lines B1-B1' and B2-B2' of FIG. 6A. FIG. 6C is a cross-sectional view illustrating sectional configurations of lines C1-C1' and C2-C2' of FIG. 6A. In FIGS. 6A through 6C, the same reference numerals as those illustrated with reference to FIGS. 1 through 5 denote the same elements and a discussion thereof will not be given.

Referring to FIGS. 6A through 6C, the integrated circuit device 500 may include a first transistor TR21 and a second transistor TR22 in a first region I and a second region II of a substrate 110, respectively. Each of the first transistor TR21 and the second transistor TR22 may have a FinFET structure.

In some example embodiments, the first region I and the second region II may be regions in which different functions are performed. For example, the first region I may be a region for forming a high-power operation device and the second region II may be a region for forming a lower-power operation device. For example, the first region I may be a region for forming a peripheral circuit (e.g., an input/output circuit device) and the second region II may be a region for forming a memory device or a logic circuit.

A first gate electrode 140A may extend across a first fin-shaped active region FA1 in the first region I, and the first transistor TR21 may be formed in a portion at which the first fin-shaped active region FA1 and the first gate electrode 140A intersect each other.

A second gate electrode 140B may extend across a second fin-shaped active region FA2 in the second region II and the second transistor TR22 may be formed in a portion at which the second fin-shaped active region FA2 and the second gate electrode 140B intersect each other.

Each of the first and second transistors TR21 and TR22 may constitute an NMOS transistor or a PMOS transistor.

In FIG. 6A, one first fin-shaped active region FA1 and one first gate electrode 140A are formed in the first region I and one second fin-shaped active region FA2 and one second gate electrode 140B are formed in the second region II, but it is not limited thereto. For example, a plurality of fin-shaped active regions and a plurality of gate electrodes may be formed in the first region I and the second region II.

The first transistor TR21 may include the first fin-shaped active region FA1 that protrudes from the substrate 110 in the first region I of the substrate 110, a first gate insulation layer 120A that covers a top surface and opposite sidewalls of a first channel region CH1 of the first fin-shaped active region FA1 by a first thickness TH21, the first gate electrode 140A that covers the first gate insulation layer 120A on a top surface and opposite sidewalls of the first fin-shaped active region FA1 and a hydrogen atomic layer 114 that is formed along an interface between the first fin-shaped active region FA1 and the first gate insulation layer 120A. The first gate insulation layer 120A may include a lower gate insulation layer 122A, a first interface layer 124A and a first high-k dielectric layer 126A. Opposite sidewalls of a first base region BA1 of the first fin-shaped active region FA1 may be covered with a device isolation layer 112.

The second transistor TR22 may include the second fin-shaped active region FA2 that protrudes from the substrate 110 in the second region II of the substrate 110, a second gate insulation layer 120B that covers a top surface and opposite sidewalls of a second channel region CH2 of the second fin-shaped active region FA2 by a second thickness TH22 less than the first thickness TH21 and the second gate electrode 140B that covers the second gate insulation layer 120B on a top surface and opposite sidewalls of the second fin-shaped active region FA2. The second gate insulation layer 120B may include a second interface layer 124B and a second high-k dielectric layer 126B. Opposite sidewalls of a second base region BA2 of the second fin-shaped active region FA2 may be covered with a device isolation layer 112.

Specific details of the first fin-shaped active region FA1 and the second fin-shaped active region FA2 are substantially the same as those of the fin-shaped active region FA described with reference to FIGS. 3A through 3C.

As illustrated in FIGS. 6A and 6C, a first width W1 of the first gate electrode 140A in a length direction (Y direction) of the first fin-shaped active region FA1 may be greater than a second width W2 of the second gate electrode 140B in a length direction (Y direction) of the second fin-shaped active region FA2.

As illustrated in FIG. 6C, in the first region I, the hydrogen atomic layer 114, the lower gate insulation layer 122A and the first interface layer 124A may be formed between the top surface and the opposite sidewalls of the first fin-shaped active region FA1 and a bottom surface of the first gate electrode 140A, and may face the bottom surface of the first gate electrode 140A. The first high-k dielectric layer 126A may be formed to face the bottom surface and opposite sidewalls of the first gate electrode 140A. In addition, in the second region II, the second interface layer 124B may be formed between the top surface and the opposite sidewalls of the second fin-shaped active region FA2 and a bottom surface of the second gate electrode 140B, and may face the bottom surface of the second gate electrode 140B. The second high-k dielectric layer 126B may be formed to face the bottom surface and opposite sidewalls of the second gate electrode 140B.

Specific details of the lower gate insulation layer 122A, the first and second interface layers 124A and 124B, the first and second high-k dielectric layers 126A and 126B and the first and second gate electrodes 140A and 140B are substantially the same as those of the lower gate insulation layer 122, the interface layer 124, the high-k dielectric layer 126 and the gate electrode 140 described with reference to FIG. 1, respectively.

In the first region I, a plurality of first source/drain regions 162A may be formed in the first fin-shaped active region FA1 at opposite sides of the first gate electrode 140A. Furthermore, a plurality of second source/drain regions 162B may be formed in the second fin-shaped active region FA2 at opposite sides of the second gate electrode 140B in the second region II.

The first and second source/drain regions 162A and 162B may have substantially the same configuration as that of the source/drain region 162 described with reference to FIGS. 3A through 3C.

FIGS. 7A through 7L are cross-sectional views illustrating process operations in a method of manufacturing an integrated circuit device according to example embodiments of the inventive concepts.

Referring to FIGS. 7A through 7L, an example method of manufacturing the integrated circuit device 500 illustrated in FIGS. 6A through 6C will be described. In FIGS. 7A through 7L, the same reference numerals as those illustrated with reference to FIGS. 1 through 6C denote the same elements and a discussion thereof will be not given.

Figure 7A:
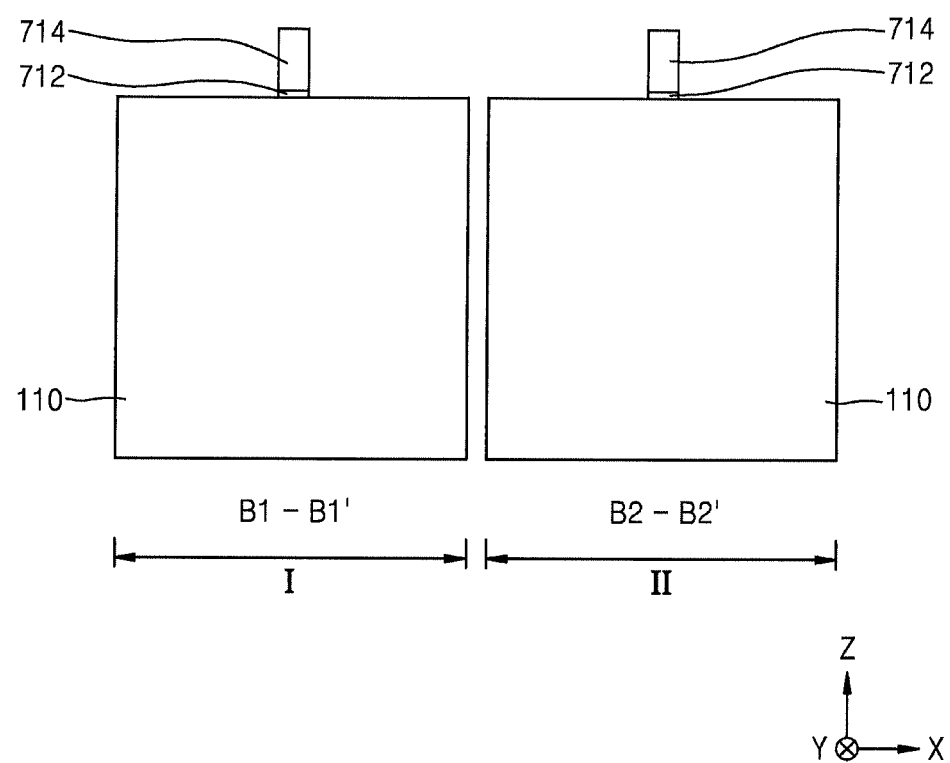
FIGS. 7A through 7L are cross-sectional views illustrating process steps in the fabrication of an integrated circuit device according to some embodiments of the inventive concepts.

Referring to FIG. 7A, a substrate 110 that includes a first region I and a second region II may be provided. A plurality of pad oxide layer patterns 712 and a plurality of mask patterns 714 may be formed on the first region I and the second region II of the substrate 110.

The plurality of pad oxide layer patterns 712 and the plurality of mask patterns 714 may extend in parallel with each other along a direction (e.g., Y direction) on the substrate 110.

In some example embodiments, each of the plurality of pad oxide layer patterns 712 may include an oxide layer that is obtained by thermally oxidizing a surface of the substrate 110. Each of the plurality of mask patterns 714 may include a silicon nitride layer, a silicon oxynitride layer, a spin-on-glass (SOG) layer, a spin-on-hardmask (SOH) layer, a photoresist layer or a combination thereof, but it is not limited thereto.

Figure 7B:
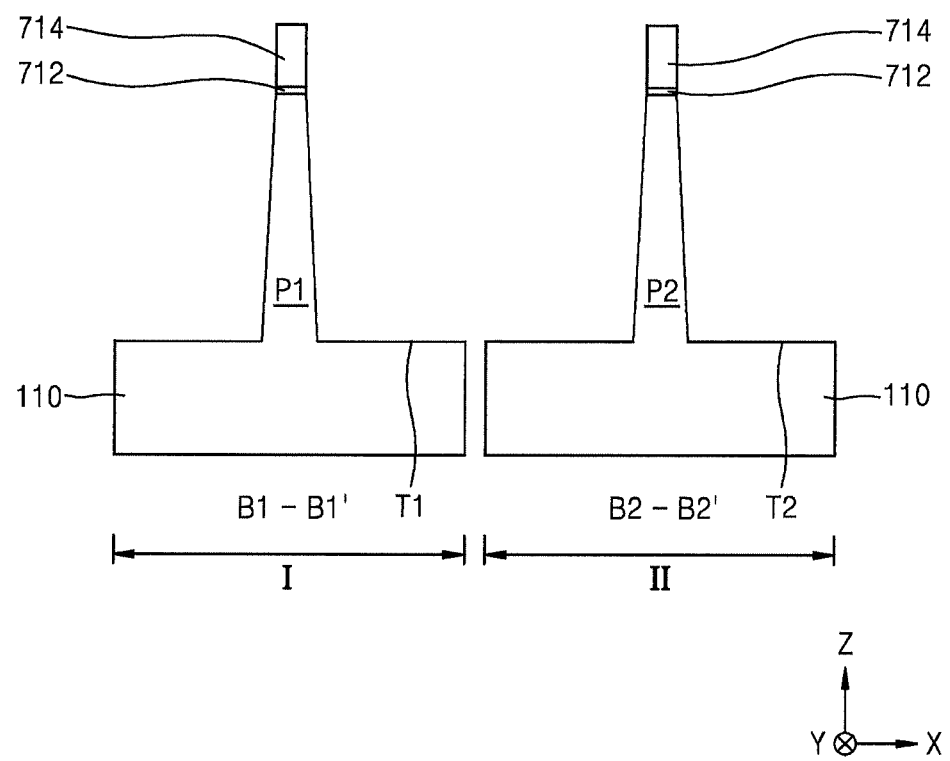

Referring to FIG. 7B, through partially etching the substrate 110 using the plurality of mask patterns 714 as etch masks, a plurality of first trenches T1 and a plurality of second trenches T2 may be formed in the first region I and the second region II, respectively.

Through forming the plurality of first and second trenches T1 and T2, a plurality of first and second preliminary fin-shaped active regions P1 and P2 may be formed in the first and second regions I and II, respectively. Each of the plurality of first and second preliminary fin-shaped active regions P1 and P2 may protrude upwardly from the substrate 110 along a direction (e.g., Z direction) perpendicular to a main surface of the substrate 110 and extend in a direction (e.g., Y direction). By the plurality of first and second trenches T1 and T2, each of the plurality of first and second preliminary fin-shaped active regions P1 and P2 may have an exposed surface (i.e., opposite sidewalls).

Figure 7C:
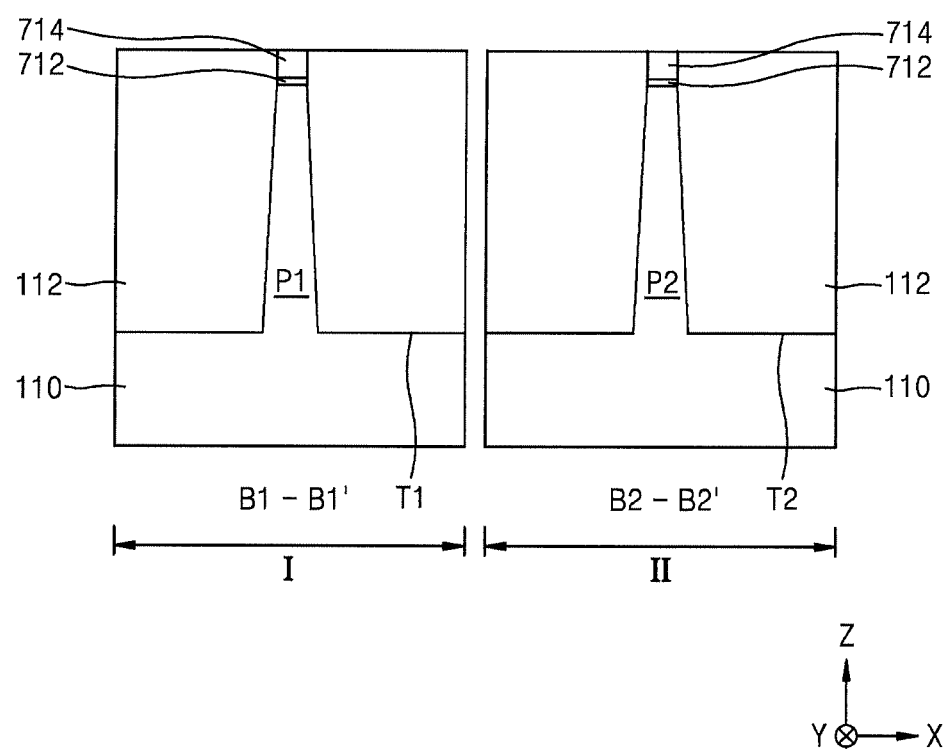

Referring to FIG. 7C, a device isolation layer 112 may be formed to fill the plurality of first and second trenches T1 and T2 and cover respective exposed surfaces of the plurality of first and second preliminary fin-shaped active regions P1 and P2 in the first and second regions I and II.

The device isolation layer 112 may be formed through a plasma enhanced chemical vapor deposition (PECVD) process, a high density plasma chemical vapor deposition (HDP CVD) process, an inductively-coupled plasma chemical vapor deposition (ICP CVD) process, a capacitively coupled plasma chemical vapor deposition (CCP CVD) process, a flowable chemical vapor deposition (FCVD) process and/or a spin coating process, but, it is not limited thereto.

After forming the device isolation layer 112, an upper portion of the device isolation layer 112 may be planarized until the plurality of mask patterns 714 are exposed. In this case, since the plurality of mask patterns 714 are partially consumed, heights of the plurality of mask patterns 714 may decrease.

Figure 7D:
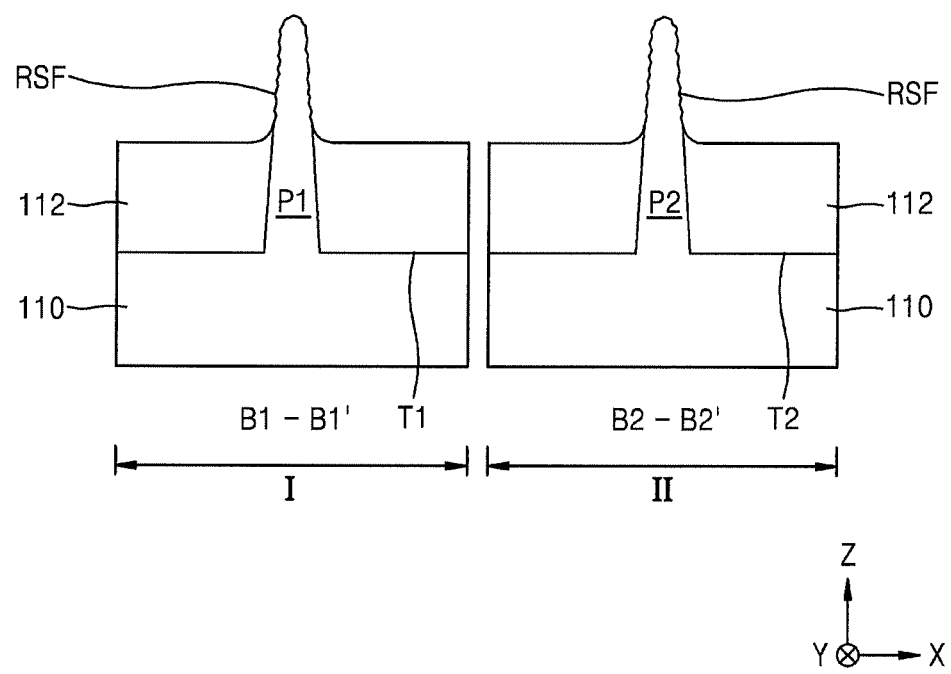

Referring to FIG. 7D, after removing the plurality of mask patterns 714 and the plurality of pad oxide layer patterns 712, a recess process for removing a portion of the device isolation layer 112 may be performed. Through the recess process, respective top surfaces and upper sidewalls of the plurality of first and second preliminary fin-shaped active regions P1 and P2 may be exposed.

Accordingly, a height of the device isolation layer 112 in the first and second regions I and II may decrease, and respective upper portions of the first and second preliminary fin-shaped active regions P1 and P2 in the first and second regions I and II may protrude above the device isolation layer 112. In other words, respective top surface and upper sidewalls of the first and second preliminary fin-shaped active regions P1 and P2 in the first and second regions I and II may be exposed.

The recess process may be performed using a dry etching process, a wet etching process or a combination process thereof.

In the case where each of the plurality of mask patterns 714 are formed of silicon nitride, the plurality of mask patterns 714 may be removed through a wet etching process using, for example, a $H_3PO_4$. The plurality of pad oxide layer pattern 712 may be removed through a wet etching process using, for example, a diluted HF (DHF).

The recess process of the device isolation layer 112 may be performed through a wet etching process using $NH_4OH$ solution, TMAH solution and/or KOH solution as an etchant, or a dry etching process, for example, a inductively-coupled plasma (ICP) process, a transformer coupled plasma (TCP) process, an electron cyclotron resonance (ECR) process or a reactive ion etch (RIE) process. The dry etching process may be performed using a fluorine-containing gas (e.g., $CF_4$), a chlorine-containing gas (e.g., $Cl_2$) or HBr, but it is not limited thereto.

During the recess process, respective upper portions of the first and second preliminary fin-shaped active regions P1 and P2 in the first and second region I and II may be exposed in an etching atmosphere (e.g., a plasma etching atmosphere). Accordingly, respective exposed surfaces RSF of the first and second preliminary fin-shaped active regions P1 and P2 may be damaged by the etching atmosphere, or a roughness, i.e., a fin edge roughness (FER), of the exposed surface RSF of each of the first and second preliminary fin-shaped active regions P1 and P2 may increase. Furthermore, due to a line edge roughness of a layer used as an etching mask pattern, the FER of the exposed surface RSF of each of the first and second preliminary fin-shaped active regions P1 and P2 may increase.

An FER of a fin-shaped active region of a highly downscaled transistor (e.g., a transistor having a gate length equal to or less than 10 nm) may lead to an asymmetric shape of the fin-shaped active region and degrade a carrier mobility of the fin-shaped active region. In addition, The FER of the fin-shaped active region of the highly downscaled transistor may cause various electrical defects (e.g., a current density decrease or a leakage current increase).

Figure 7E:
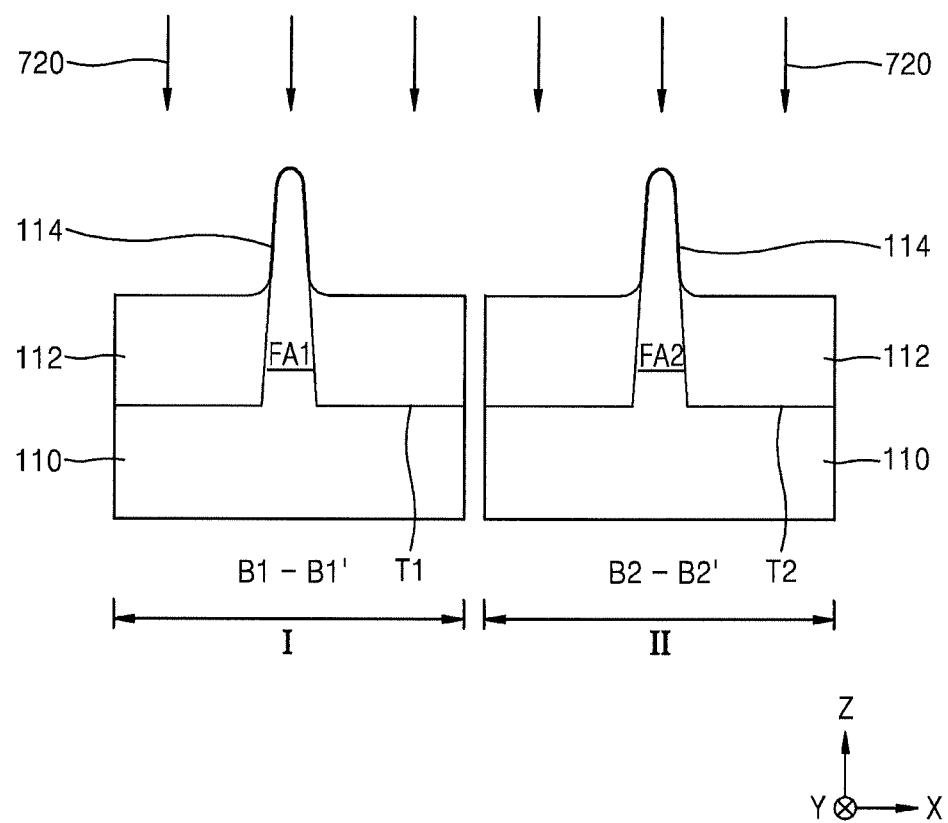

Referring to FIG. 7E, In order to cure the respective surface damages of the first and second preliminary fin-shaped active regions P1 and P2 that are respectively formed in the first and second regions I and II and improve the respective FERs thereof, after performing the recess process described with reference to FIG. 7D, the exposed surface RSF of each of the first and second preliminary fin-shaped active regions P1 and P2 may be annealed in a hydrogen atmosphere 720.

In some example embodiments, the hydrogen atmosphere 720 may include a protium ($H_2$) gas or a deuterium ($D_2$) gas. In other example embodiments, the hydrogen atmosphere 720 may include a mixture gas of an inert gas (e.g., Ar, He, Ne or $N_2$) and at least one of a $H_2$ gas and a $D_2$ gas. For example, the mixture gas may include a hydrogen gas having an amount of 5 to 30 percent by volume, but it is not limited thereto.

In some example embodiments, the annealing in the hydrogen atmosphere 720 may be carried out at a temperature ranging from 600 C.° to 900 C.° and a pressure ranging from 1 to 20 torr for 5 to 60 seconds, but it is not limited thereto.

During the annealing process in the hydrogen atmosphere 720, a hydrogen-enhanced surface atom migration may be induced on the exposed surface RSF of each of the first and second preliminary fin-shaped active regions P1 and P2 (Refer to FIG. 7D). Through the hydrogen-enhanced surface atom migration, semiconductor atoms (e.g., Si atoms) constituting the first and second preliminary fin-shaped active regions P1 and P2 may move from a convex portion of the exposed surface RSF of each of the first and second preliminary fin-shaped active regions P1 and P1 and be accumulated in a concave portion thereof. Accordingly, since a roughness of the exposed surface RSF of each of the first and second preliminary fin-shaped active regions P1 and P2 decreases and morphology thereof changes, each of first and second fin-shaped active regions FA1 and FA2 may be formed to have a smooth outer surface.

Furthermore, during the annealing process in the hydrogen atmosphere 720, a reaction by-product or a contaminant (e.g., $HF_X$ or $CH_X$) remaining on the exposed surface RSF of each of the first and second preliminary fin-shaped active regions P1 and P2 may be removed.

After exposing the surface RSF of each of the first and second preliminary fin-shaped active regions P1 and P2 through the recess process of the device isolation layer 112 described with reference to FIG. 7D, the annealing process in the hydrogen atmosphere 720 may be directly carried out without performing a wet etching process. Thus, the first and second preliminary fin-shaped active regions P1 and P2 may be prevented from consumption by the wet etching process, and thereby preventing a decrease of a width and a height of a protruding portion of each of the first and second preliminary fin-shaped active region P1 and P2. As a result, a difference between a lower width and an upper width of each of the first and second fin-shaped active regions FA1 and FA2 may be reduced.

During the annealing process in the hydrogen atmosphere 720, hydrogen molecules (e.g., $H_2$ molecules or $D_2$ molecules) may be adsorbed onto a surface of each of the first and second fin-shaped active regions FA1 and FA2, and hydrogen atoms may be combined with dangling bond sites that are formed onto the surface of the first and second fin-shaped active regions FA1 and FA2. Accordingly, through the annealing process in the hydrogen atmosphere 720, a smoothness of the exposed surface RSF (Refer to FIG. 7D) of each of the first and second preliminary fin-shaped active regions P1 and P2 may increase. Consequently, the first and second fin-shaped active regions FA1 and FA2, each of which has a smooth outer surface, may be formed. At the same time, a hydrogen atomic layer 114 may be formed to cover the smooth surface of each of the first and second fin-shaped active regions FA1 and FA2.

By the hydrogen atomic layer 114 covering the first and second fin-shaped active regions FA1 and FA2, each of the first and second fin-shaped active regions FA1 and FA2 may have a surface terminated by hydrogen atoms constituting the hydrogen atomic layer 114.

In some example embodiments, an ion implantation process for adjusting a threshold voltage may be carried out in respective upper portions of the first and second fin-shaped active regions FA1 and FA2 in the first and second regions I and II. The ion implantation process for adjusting a threshold voltage may be performed such that boron (B) ions as an impurity are injected in a region for forming an NMOS transistor in the first and second regions I and II, and phosphorus (P) or arsenic (As) ions as an impurity are injected in a region for forming a PMOS transistor in the first and second regions I and II. The ion implantation process for adjusting a threshold voltage may be performed prior to forming the hydrogen atomic layer 114 described with reference to FIG. 7E, or after forming the hydrogen atomic layer 114.

Figure 7F:
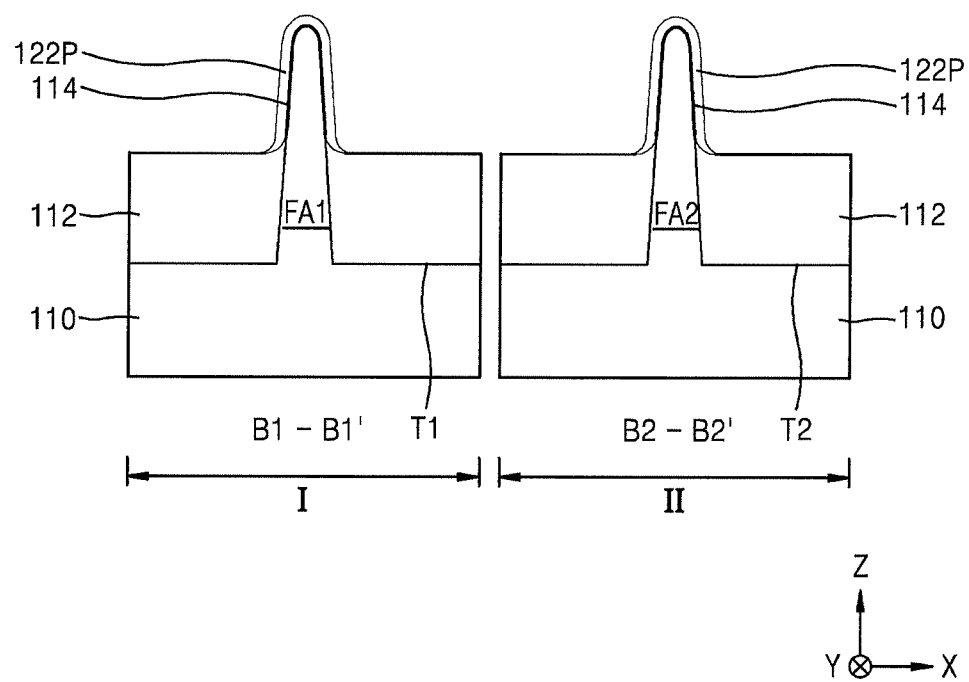
Figure 7G:
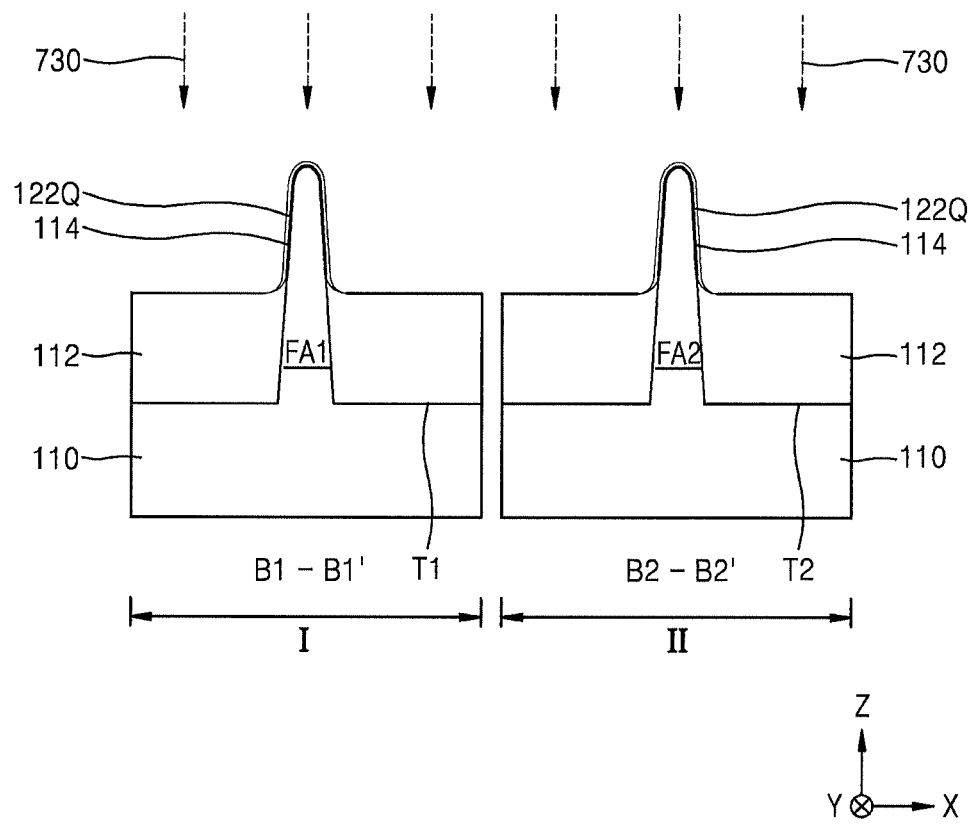
Figure 7H:
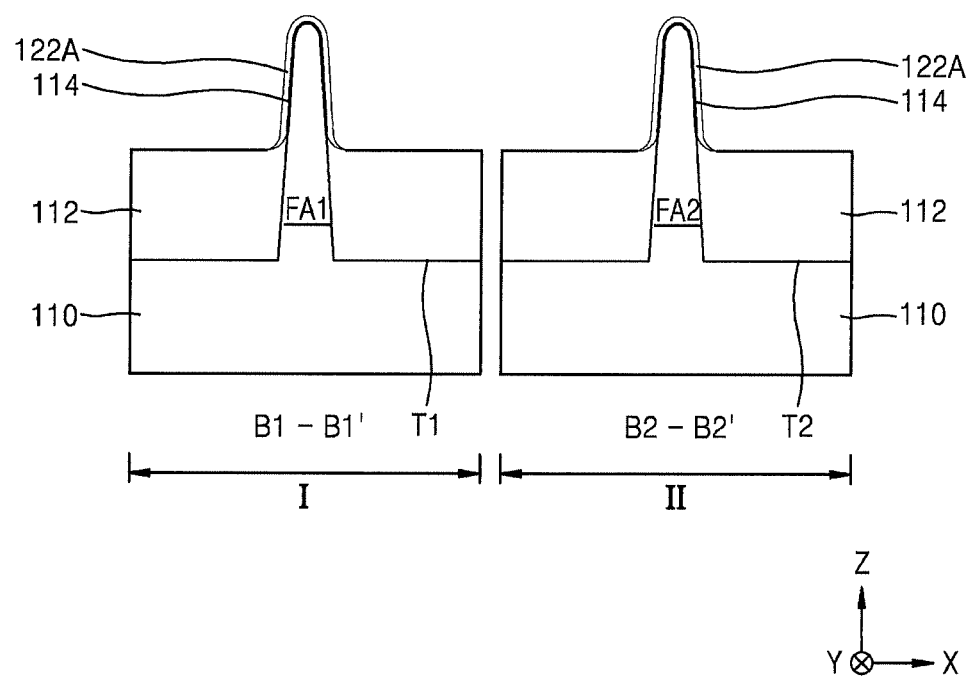

FIGS. 7F through 7H are cross-sectional views illustrating example process operations for forming a lower gate insulation layer 122A (Refer to FIG. 7H) on the first and second fin-shaped active regions FA1 and FA2 that are covered with the hydrogen atomic layer 114 in the first and second regions I and II.

Referring to FIG. 7F, an oxide layer 122P may be formed on the hydrogen atomic layer 114 in the first and second regions I and II.

The oxide layer 122P may be a preliminary layer for forming the lower gate insulation layer 122A (Refer to FIG. 7H) and may be formed by a first oxidation treatment using a plasma.

In some example embodiments, to form the oxide layer 122P through the first oxidation treatment, a radical oxidation process may be performed on the first and second fin-shaped active regions FA1 and FA2 using a plasma atmosphere in a plasma processing apparatus. In some example embodiments, the oxide layer 122P may be formed in the plasma atmosphere that is obtained by an oxygen molecule ($O_2$) gas and an inert gas. In some example embodiments, the oxide layer 122P may be formed in the plasma atmosphere that is obtained by an oxygen molecule ($O_2$) gas, an inert gas and a hydrogen molecule ($H_2$) gas. For example, to form the plasma atmosphere, an oxygen molecule ($O_2$) gas and an inert gas may be supplied in the plasma processing apparatus. Or, to form the plasma atmosphere, an oxygen molecule ($O_2$) gas, an inert gas and a hydrogen molecule ($H_2$) gas may be supplied in the plasma processing apparatus. Through controlling an amount of an oxygen ion or an oxygen radical in the plasma atmosphere, the oxide layer 122P may be formed to have a uniform thickness on the hydrogen atomic layer 114. In this case, an FER of each of the first and second fin-shaped active regions FA1 and FA2 may not deteriorate and the outer surface of the each of the first and second fin-shaped active regions FA1 and FA2 may maintain a smooth surface state.

The first oxidation treatment may be carried out using various plasma processing apparatuses. For example, the first oxidation treatment may be performed using a radial line slot antenna (RLSA) microwave plasma processing apparatus, a remote plasma process apparatus, an inductively coupled plasma (ICP) processing apparatus, an electron cyclotron resonance (ECR) plasma processing apparatus, a surface reflected wave plasma processing apparatus or a magnetron plasma processing apparatus.

The oxide layer 122P may be formed to have a thickness ranging from 10 Å to 40 C.°, but it is not limited thereto.

Referring to FIG. 7G, a thickness-reduced oxide layer 122Q may be formed through partially removing the oxide layer 122P (Refer to FIG. 7F) using an etching atmosphere 730 in the first and second regions I and II such that the first and second fin-shaped active regions FA1 and FA2 are not exposed.

In some example embodiments, the etching atmosphere 730 may be a wet etching atmosphere. For example, the oxide layer 122P may be partially removed using a HF solution. Because the first and second fin-shaped active regions FA1 and FA2 are not exposed in the process of removing a portion of the oxide layer 122P using the HF solution, the first and second fin-shaped active regions FA1 and FA2 may be prevented from being consumed by the wet etching. Accordingly, the FER of each of the first and second fin-shaped active regions FA1 and FA2 may not deteriorate and each of the first and second fin-shaped active regions FA1 and FA2 may have a smooth surface. In addition, the first and second fin-shaped active regions FA1 and FA2 may be prevented from decreasing in a width and a height thereof, thereby reducing a difference between a lower width and an upper width of each of the first and second fin-shaped active regions FA1 and FA2.

Referring to FIG. 7H, the lower gate insulation layer 122A may be formed by increasing a thickness of the thickness-reduced oxide layer 122Q covering the hydrogen atomic layer 114 using a second oxidation treatment that does not use a plasma.

The second oxidation treatment may be carried out through an in-situ steam generation (ISSG) process using steam, or a combination of a hydrogen ($H_2$) gas and an oxygen ($O_2$) gas. By increasing the thickness of the thickness-reduced oxide layer 122Q using the ISSG process, the lower gate insulation layer 122A having an excellent film property may be obtained.

The lower gate insulation layer 122A may be formed to cover a top surface and opposite sidewalls of each of the first and second fin-shaped active regions FA1 and FA2 in the first and second regions I and II.

In some example embodiments, the lower gate insulation layer 122A may have a thickness ranging from 10 Å to 50 Å, but it is not limited thereto.

In some example embodiments, the lower gate insulation layer 122A may be formed through increasing the thickness of the thickness-reduced oxide layer 122Q by the ISSG process and successively nitride-treating a portion of the thickness-increased oxide layer. The lower gate insulation layer 122A may be formed of silicon oxynitride. The nitridation treatment may be carried out using a decoupled plasma nitridation (DPN) process. The lower gate insulation layer 122A obtained by the nitridation treatment may have the highest nitrogen concentration in an inner portion adjacent to an outer surface of the lower gate insulation layer 122A in the total thickness range thereof. For example, the lower gate insulation layer 122A may have a nitrogen concentration peak region in which a nitrogen atom concentration is the greatest in an inner portion of the depth of about 0.5 nm from the outer surface of the lower gate insulation layer 122A.

Figure 7I:
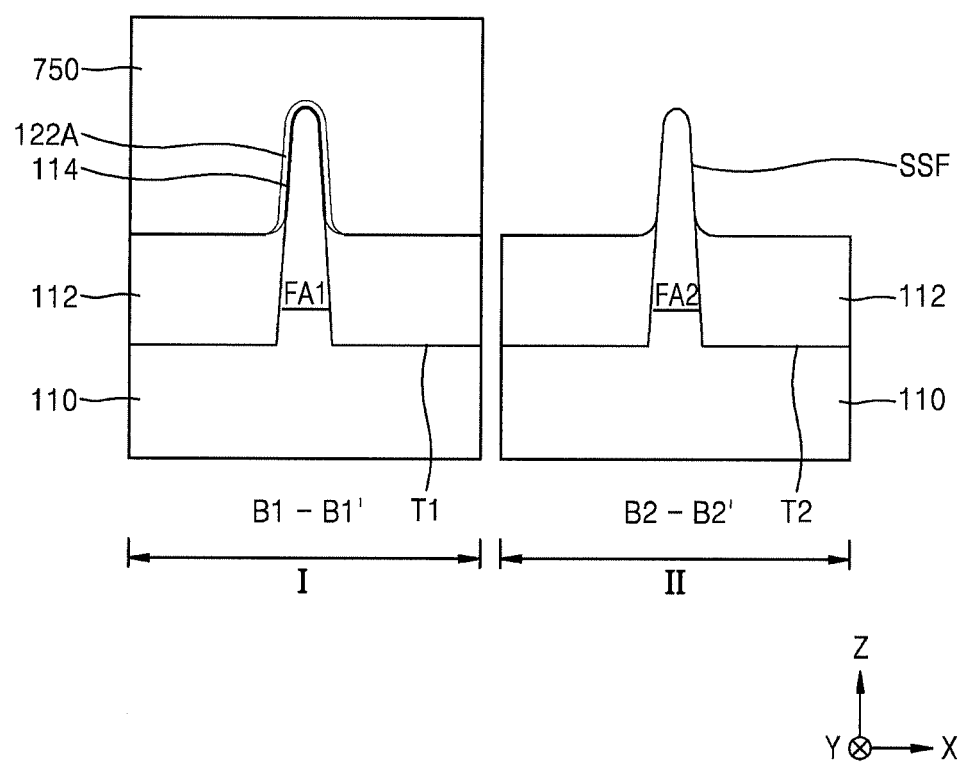

Referring to FIG. 7I, after forming a mask pattern 750 on the first region I to expose the second region II, a smooth surface SSF of the second fin-shaped active region FA2 in the second region II may be exposed by removing the hydrogen atomic layer 114 and the lower gate insulation layer 122A in the second region II. During removal of the hydrogen atomic layer 114 and the lower gate insulation layer 122A in the second region II, the mask pattern 750 may serve to protect the hydrogen atomic layer 114 and the lower gate insulation layer 122A that are formed on the first fin-shaped active region FA1 in the first region I. The mask pattern 750 may be formed of a photoresist pattern.

Some of the hydrogen atoms constituting the hydrogen atomic layer 114 may remain onto the smooth surface SSF of the second fin-shaped active region FA2 exposed by removing the hydrogen atomic layer 114 and the lower gate insulation layer 122A in the second region II.

Figure 7J:
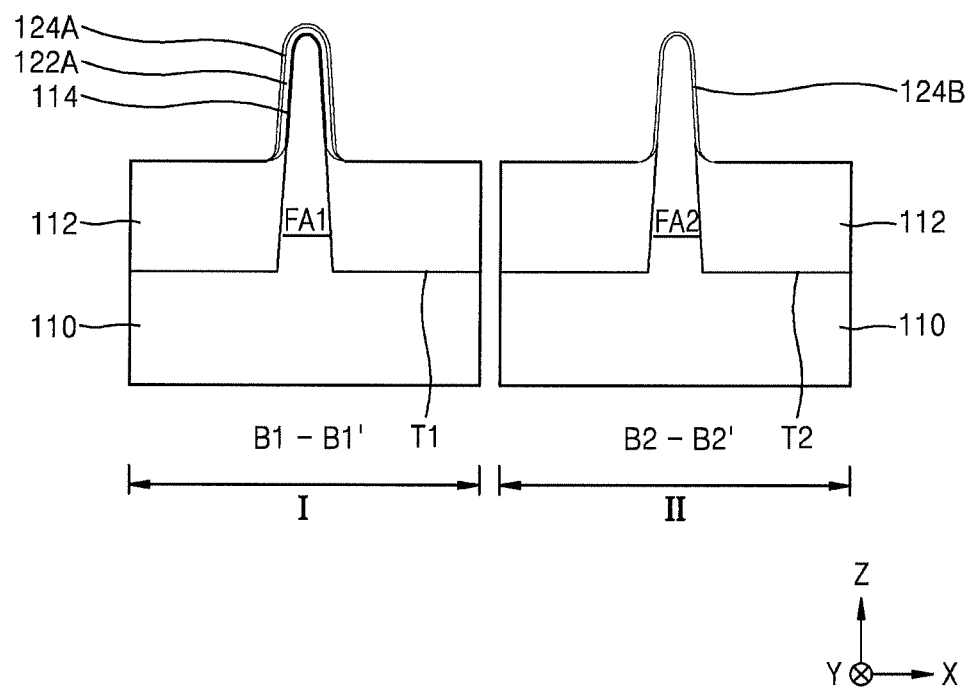

Referring to FIG. 7J, after removing the mask pattern 750 (Refer to FIG. 7I) covering the first region I, a first interface layer 124A may be formed in the first region I to contact the lower gate insulation layer 122A, and a second interface layer 124B may be formed to contact the smooth surface SSF of the second fin-shaped active region FA2 in the second region II.

In some example embodiments, the second interface layer 124B may be formed by oxidizing a surface of the second fin-shaped active region FA2 in the second region II. The second interface layer 124B in the second region II may serve to cure an interface defect between the second fin-shaped active region FA2 and a second high-k dielectric layer 126B (Refer to FIG. 7K).

In some example embodiments, each of the first interface layer 124A and the second interface layer 124B may be formed of a low-k dielectric material layer (e.g., silicon oxide, silicon oxynitride or a combination thereof) having a dielectric constant equal to or less than 9 (e.g., ranging from 1 to 9). In other example embodiments, each of the first and second interface layers 124A and 124B may be formed of silicate, a combination of silicate and silicon oxide, or a combination of silicate and silicon oxynitride. In some example embodiments, each of the first and second interface layers 124A and 124B may have a thickness ranging from 5 Å to 20 Å, but it is not limited thereto.

In some example embodiments, the first and second interface layers 124A and 124B may be omitted.

Figure 7K:
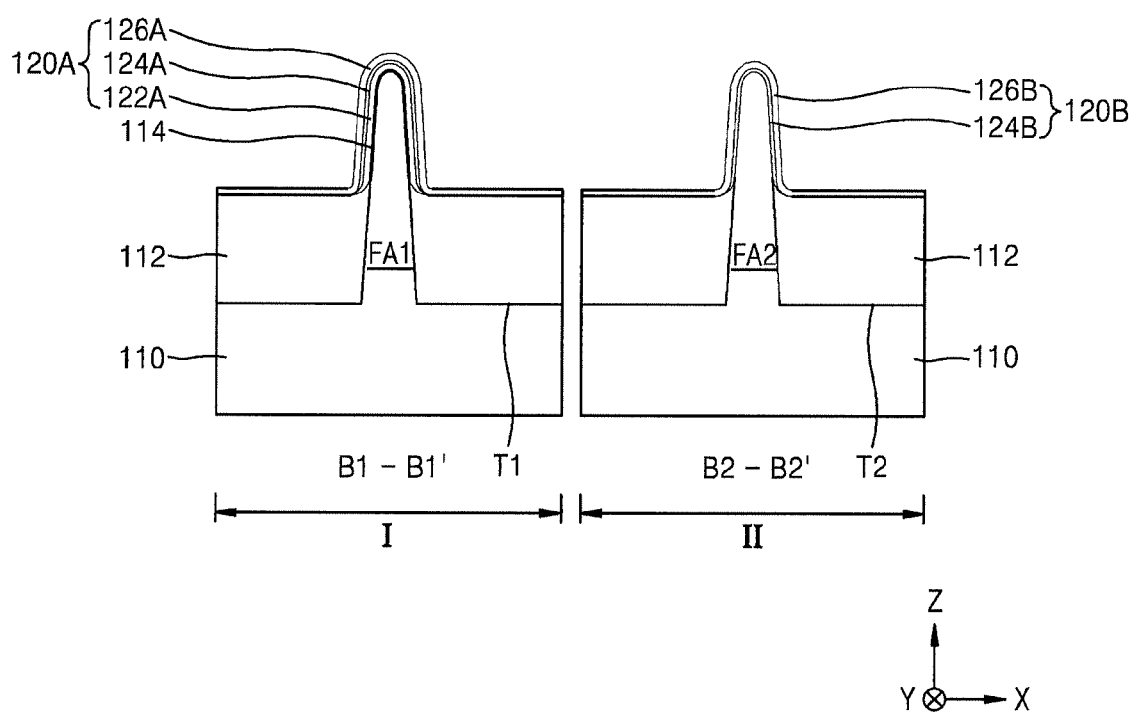

Referring to FIG. 7K, a first high-k dielectric layer 126A may be formed on the first interface layer 124A in the first region I and a second high-k dielectric layer 126B may be formed on the second interface layer 124B in the second region II.

In some example embodiments, the first and second high-k dielectric layers 126A and 126B may be formed through an ALD process, a CVD process or a PVD process. Each of the first and second high-k dielectric layers 126A and 126B may have a thickness ranging from 10 Å to 40 Å, but it is not limited thereto.

Figure 7L:
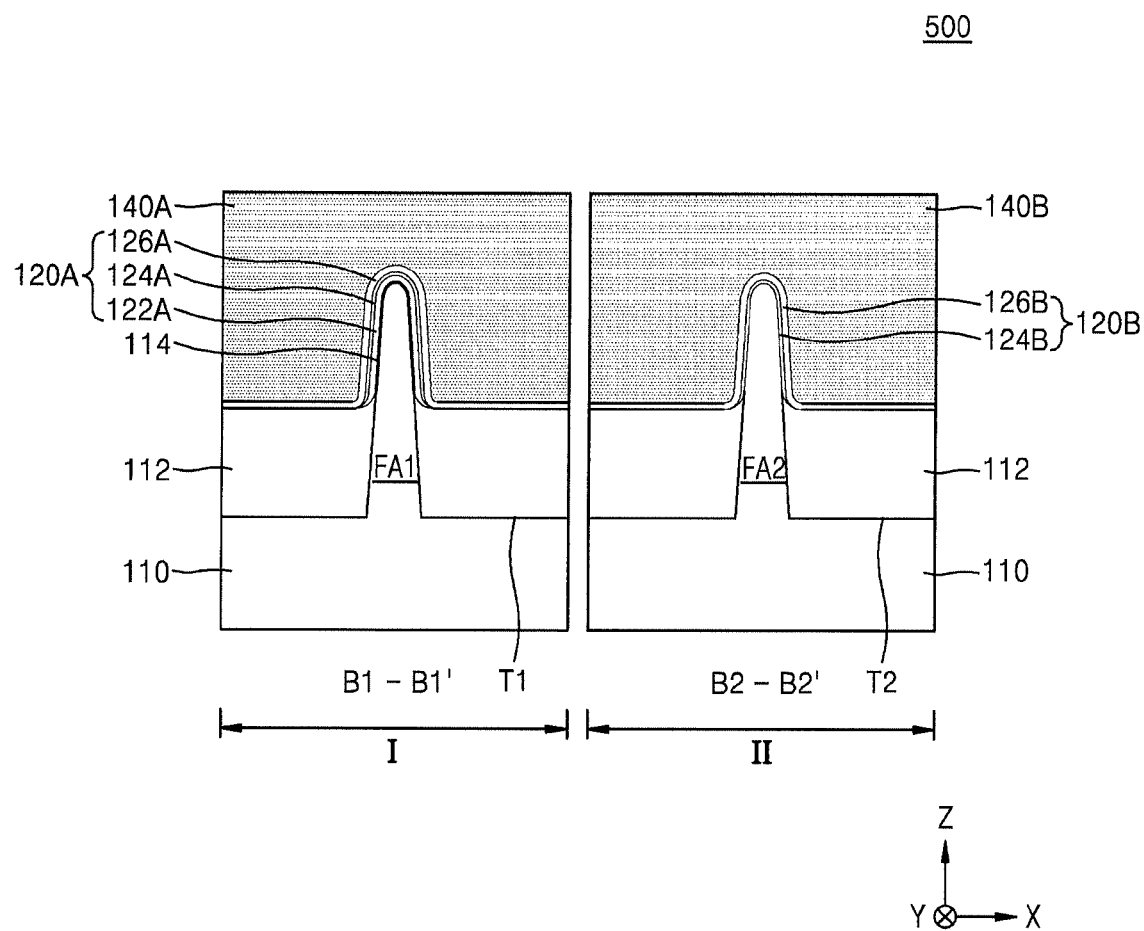

Referring to FIG. 7L, a first gate electrode 140A may be formed on the first high-k dielectric layer 126A in the first region I and a second gate electrode 140B may be formed on the second high-k dielectric layer 126B in the second region II.

Prior to or after forming the first and second gate electrodes 140A and 140B in the first and second regions I and II, first and second source/drain regions 162A and 162B (Refer to FIG. 6C) may be formed in the first and second fin-shaped active regions FA1 and FA2, respectively.

In some example embodiments, at least one of the first and second gate electrodes 140A and 140B may be formed through a replacement poly-gate (RPG) process. As an example process for forming the first and second gate electrodes 140A and 140B through the RPG process, after forming the lower gate insulation layer 122A described with reference to FIGS. 7F through 7H, a sacrificial gate layer (e.g., poly-silicon) may be formed on the lower gate insulation layer 122A. Next, a sacrificial pattern may be formed through patterning a stacked structure of the sacrificial gate layer and the lower gate insulation layer 122A, and an insulating spacer 172 (Refer to FIG. 6C) may be formed to cover opposite sidewalls of the sacrificial pattern. Next, in the first region I, the sacrificial gate layer of the sacrificial pattern may be removed and the lower gate insulation layer 122A may be exposed through a gate space delimited by the insulating spacer 172. In addition, after removing the sacrificial gate layer of the sacrificial pattern in the second region II, the hydrogen atomic layer 114 and the lower gate insulation layer 122A in the second region II may be removed using the method described with reference to FIG. 7I, and the smooth surface SSF of the second fin-shaped active region FA2 through a gate space delimited by the gate spacer 172 may be exposed in the second region II.

Next, through the method described with reference to FIGS. 7J through 7L, the first and second interface layers 124A and 124B, the first and second high-k dielectric layers 126A and 126B and the first and second gate electrodes 140A and 140B may be sequentially formed in the first and second regions I and II, respectively.

According to the manufacturing method of the integrated circuit device 500 described with reference to FIGS. 7A through 7L, a highly scaled-down fin-shaped active region (e.g., FA1 or FA2) may be provided to have a smooth surface by minimizing a difference between a width of an upper portion and a width of a lower portion thereof and a surface roughness thereof and accordingly, a performance of a highly scaled-down fin field effect transistor (FET) may improve.

The method of manufacturing the integrated circuit device 500 illustrated in FIGS. 6A through 6C is described with reference to FIGS. 7A through 7L, but integrated circuit devices (e.g., the integrated circuit device 100 illustrated in FIG. 1, the integrated circuit device 200 illustrated in FIGS. 3A through 3C and the integrated circuit device 400 illustrated in FIG. 5) having various structures illustrated herein using a variety of modificated and changed methods within the scope of the technical idea of the present disclosure may be easily implemented.

Furthermore, the method of manufacturing the integrated circuit device including a FinFET having a channel of a three-dimensional structure is described with reference to FIGS. 7A through 7L, but it is not limited thereto. For example, through a variety of modifications and changes of the technical features of the present disclosure, integrated circuit devices including a planar MOSFET having features of the technical idea of the present disclosure and methods of manufacturing the same may be provided.

Figure 8:
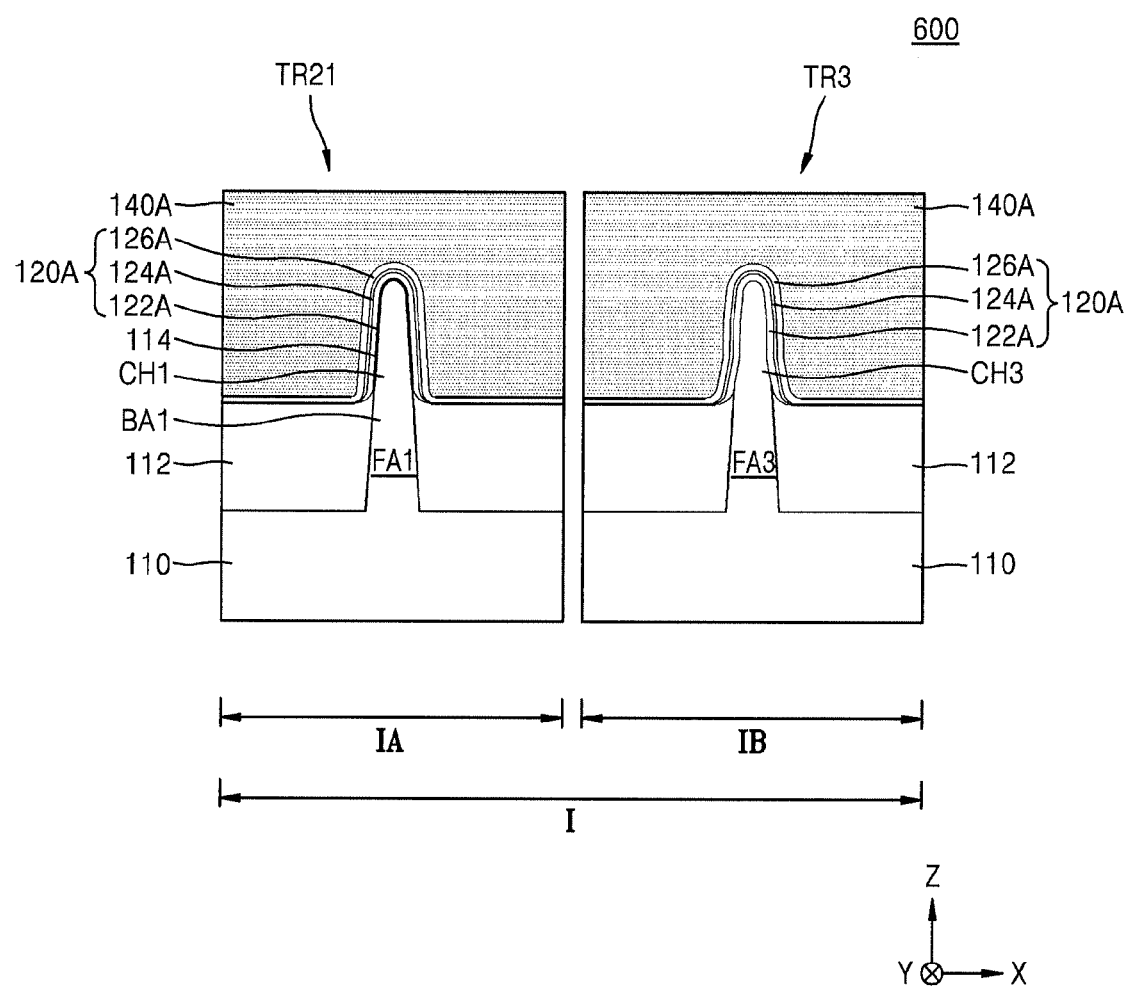

FIG. 8 is a cross-sectional view illustrating essential parts of an integrated circuit device 600 according to example embodiments of the inventive concepts. In FIG. 8, the same reference numerals as those illustrated with reference to FIGS. FIGS. 1 through 6 denote the same elements and a discussion thereof will be not given.

Referring to FIG. 8, a substrate 110 of the integrated circuit device 600 may include a first local region IA and a second local region IB that are divided each other in a first region I.

The first local region IA and the second local region IB may be spaced apart from each other or may be connected to each other. Each of the first local region IA and the second local region IB may be a region for forming a transistor having a high reliability, even though a threshold voltage thereof is relatively high and a switching speed thereof is not faster. In some example embodiments, each of the first local region IA and the second local region IB may constitute a part of an input/output (I/O) circuit device.

The integrated circuit device 600 may include a first transistor TR21 in the first local regions IA and a third transistor TR3 in the second local region IB. Each of the first and third transistors TR21 and TR3 may have a Fin FET structure. The first transistor TR21 may have substantially the same configuration as that illustrated with reference to FIGS. 6A through 6C. The third transistor TR3 may include a third fin-shaped active region FA3 having a third channel region CH3 with a width less than a width of a first channel region CH1 of the first transistor TR21.

The third fin-shaped active region FA3 may be formed through a forming process similar to the forming process of the first fin-shaped active region FA1. In some example embodiments, the method of manufacturing the third fin-shaped active region FA3 may not include the annealing process in the hydrogen atmosphere 720 described with reference to FIG. 7E. Accordingly, a hydrogen atomic layer 114 may not be formed on an upper surface of the third transistor TR3. Instead, a lower gate insulation layer 122A may be formed to contact the upper surface of the third transistor TR3.

Figure 9:
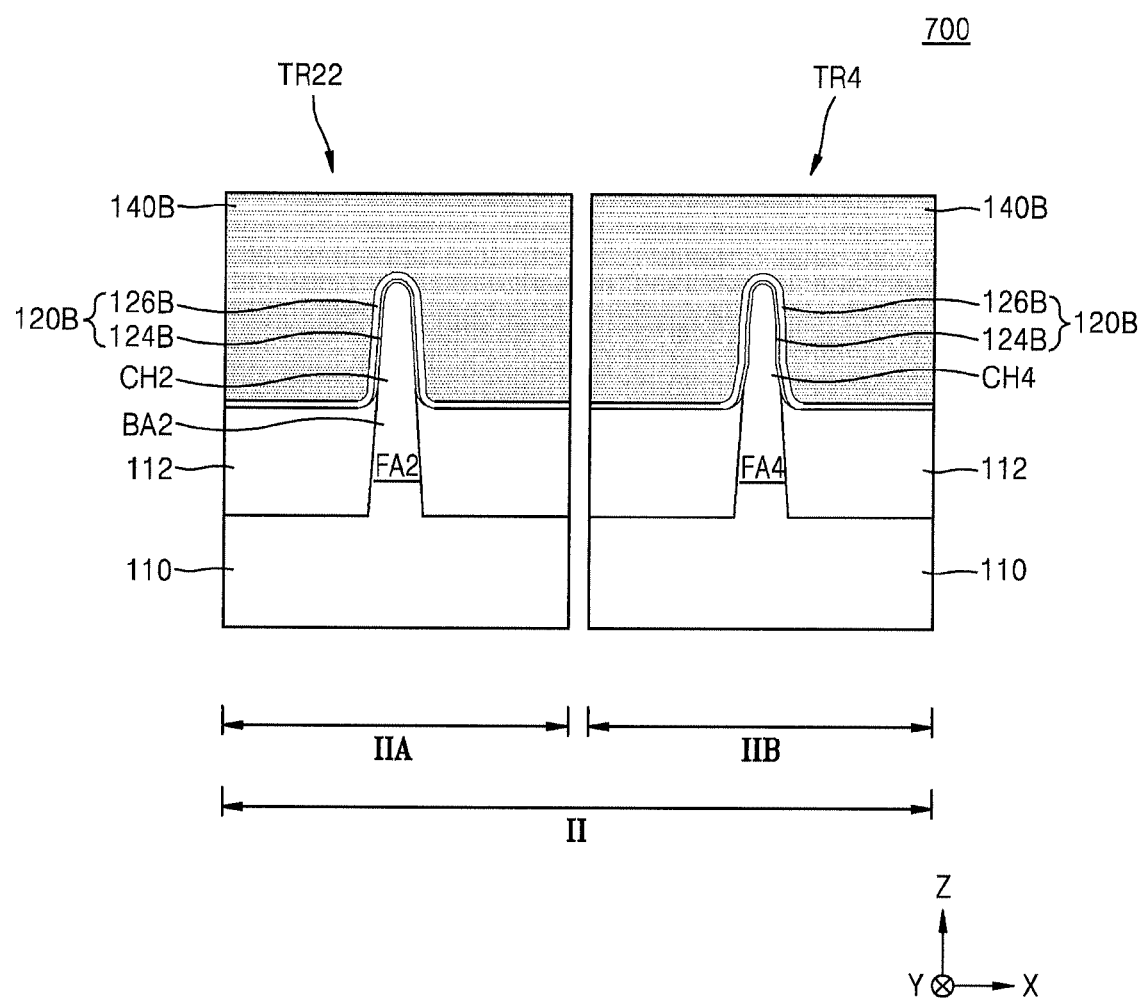

FIG. 9 is a cross-sectional view illustrating essential parts of an integrated circuit device 700 according to example embodiments of the inventive concepts. In FIG. 9, the same reference numerals as those illustrated with reference to FIGS. FIGS. 1 through 6 denote the same elements and a discussion thereof will be not given.

Referring to FIG. 9, a substrate 110 of the integrated circuit device 700 may include a third local region IIA and a fourth local region IIB that are divided each other in a second region II.

The third local region IIA and the fourth local region IIB may be spaced apart from each other or may be connected to each other. Each of the third local region IIA and the fourth local region IIB may be a low voltage region for forming a low voltage transistor to which a relatively low operating voltage is applied. In some example embodiments, each of the third local region IIA and the fourth local region IIB may be a cell array region in which multiple unit memory cells are arranged in a matrix form. In some example embodiments, each of the third local region IIA and the fourth local region IIB may be a logic cell region or a memory cell region.

The integrated circuit device 700 may include a second transistor TR22 in the third local regions IIA and a fourth transistor TR4 in the fourth local region IIB. Each of the second and fourth transistors TR22 and TR4 may have a Fin FET structure. The second transistor TR22 may have substantially the same configuration as that illustrated with reference to FIGS. 6A through 6C. The fourth transistor TR4 may include a fourth fin-shaped active region FA4 having a fourth channel region CH4 with a width less than a width of a second channel region CH2 of the second transistor TR22.

The fourth fin-shaped active region FA4 may be formed through a forming process similar to the forming process of the second fin-shaped active region FA2. In some example embodiments, the method of manufacturing the third fin-shaped active region FA4 may not include the annealing process in the hydrogen atmosphere 720 described with reference to FIG. 7E. Accordingly, a second interface layer 124B may be formed to contact an upper surface of the fourth transistor TR4.

According to example embodiments of the inventive concepts, a highly scaled-down fin-shaped active region having a smooth surface may be provided by minimizing a difference between a top portion width and a bottom portion width thereof and by minimizing a surface roughness thereof. Accordingly, a performance of a highly scaled-down fin field effect transistor (FET) may improve.

Figure 10:
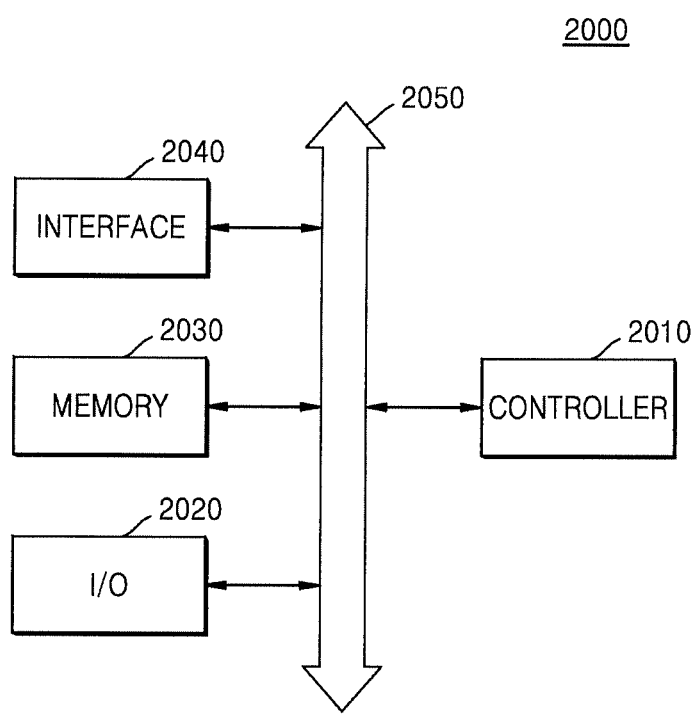

FIG. 10 illustrates a block diagram of an electronic system 2000 according to example embodiments of the inventive concepts.

The electronic system 2000 may include a controller 2010, an input/output (I/O) device 2020, a memory 2030, and an interface 2040 connected to each other through a bus 2050.

The controller 2010 may include at least one of a microprocessor, a digital signal processor, and a similar processor. The I/O device 2020 may include at least one of a keypad, a keyboard, and a display. The memory 2030 may be used for storing commend executed by the controller 2010. For example, the memory 2030 may be used for storing user data.

The electronic system 2000 may constitute a device capable of transmitting and/or receiving information in a wireless communication device or under a wireless environment. The interface 2040 of the electronic system 2000 may be configured with a wireless interface to transmit and receive data through a wireless communication network. The interface 2040 may include an antenna and/or a wireless transceiver. In an example embodiment, the electronic system 2000 may be used for a communication interface protocol of third generation communication system such as a code division multiple access (CDMA), a global system for mobile communications (GSM), a north American digital cellular (NADC), an extended-time division multiple access (E-TDMA), and a wide band code division multiple access (WCMA). The electronic system 2000 may include at least one of the integrated circuit devices 100, 200, 300, 400, 500, 600 and 700 according to example embodiments of the inventive concepts described with reference to FIGS. 1 through 8 and modified integrated circuit devices within the scope of the inventive concepts from these.

While the inventive concepts have been particularly shown and described with reference to example embodiments thereof, it will be understood that various changes in form and details may be made therein without departing from the spirit and scope of the following claims.

What is claimed is:

1. An integrated circuit device comprising:
   a fin-shaped active region;
   a gate insulation layer covering a top surface and opposite sidewalls of the fin-shaped active region;
   a gate electrode covering the gate insulation layer on the top surface and on the opposite sidewalls of the fin-shaped active region; and
   a hydrogen atomic layer extending along an interface between the fin-shaped active region and the gate insulation layer.

2. The integrated circuit device of claim 1, wherein the hydrogen atomic layer comprises at least one of a protium atom ($^1$H) and a deuterium atom ($^2$H).

3. The integrated circuit device of claim 1, wherein the gate insulation layer comprises:
   an interface layer on the hydrogen atomic layer; and
   a high-k dielectric layer on the interface layer, the high-k dielectric layer having a dielectric constant greater than a dielectric constant of the interface layer.

4. The integrated circuit device of claim 3, wherein the gate insulation layer further comprises a lower gate insulation layer between the hydrogen atomic layer and the interface layer, the lower gate insulation layer contacting the hydrogen atomic layer.

5. An integrated circuit device comprising:
   a substrate having a first region and a second region;
   a first transistor in the first region; and
   a second transistor in the second region,
   wherein the first transistor comprises:
      a first fin-shaped active region protruding from the substrate;
      a hydrogen atomic layer contacting a top surface and opposite sidewalls of the first fin-shaped active region;
      a first gate insulation layer covering the hydrogen atomic layer; and
      a first gate electrode covering the first gate insulation layer on the top surface and on the opposite sidewalls of the first fin-shaped active region, and
   wherein the second transistor comprises:
      a second fin-shaped active region protruding from the substrate;

a second gate insulation layer contacting a top surface and opposite sidewalls of the second fin-shaped active region; and a second gate electrode covering the second gate insulation layer on the top surface and on the opposite sidewalls of the second fin-shaped active region.

6. The integrated circuit device of claim 5, wherein the first gate insulation layer has a first thickness, and the second gate insulation layer has a second thickness different from the first thickness.

7. The integrated circuit device of claim 6, wherein the second thickness is smaller than the first thickness.

8. The integrated circuit device of claim 5, wherein the hydrogen atomic layer comprises at least one of a protium atom ($^1$H) and a deuterium atom ($^2$H).

9. The integrated circuit device of claim 5, wherein a width of the first gate electrode in a longitudinal direction of the first fin-shaped active region is greater than a width of the second gate electrode in a longitudinal direction of the second fin-shaped active region.

10. The integrated circuit device of claim 5, wherein the first gate insulation layer comprises:
a first interface layer on the hydrogen atomic layer; and
a first high-k dielectric layer on the first interface layer, the first high-k dielectric layer having a dielectric constant greater than a dielectric constant of the first interface layer, and
wherein the second gate insulation layer comprises:
a second interface layer contacting the second fin-shaped active region; and
a second high-k dielectric layer on the second interface layer, the second high-k dielectric layer having a dielectric constant greater than a dielectric constant of the second interface layer.

11. The integrated circuit device of claim 10, wherein the first gate insulation layer further comprises a lower gate insulation layer between the hydrogen atomic layer and the first interface layer, the lower gate insulation layer contacting the hydrogen atomic layer.

12. The integrated circuit device of claim 10, wherein the first gate insulation layer further comprises a lower gate insulation layer between the hydrogen atomic layer and the first interface layer, the lower gate insulation layer comprises silicon oxynitride, and the lower gate insulation layer has a variable nitrogen concentration along a depth direction from an outer surface of the lower gate insulation layer.

13. The integrated circuit device of claim 10, wherein the first gate insulation layer further comprises a lower gate insulation layer between the hydrogen atomic layer and the first interface layer, the lower gate insulation layer comprises silicon oxynitride, and a nitrogen concentration in an inner portion of the lower gate insulation layer is greater than a nitrogen concentration in a surface of the lower gate insulation layer.

14. The integrated circuit device of claim 5, wherein the first region is a peripheral circuit region of the integrated circuit device, and
wherein the second region is one of a logic cell region and a memory cell region of the integrated circuit device.

15. An integrated circuit device comprising:
a substrate having a first local region and a second local region;
a first transistor in the first local region; and
a second transistor in the second local region,
wherein the first transistor comprises:
a first channel region having a first width;
a first gate insulation layer covering the first channel region;
a first gate electrode covering the first channel region with the first gate insulation layer interposed between the first channel region and the first gate electrode; and
a hydrogen atomic layer extending along an interface between the first channel region and the first gate insulation layer, and
wherein the second transistor comprises:
a second channel region having a second width different from the first width;
a second gate insulation layer contacting the second channel region; and
a second gate electrode covering the second channel region with the second gate insulation layer interposed between the second channel region and the second gate electrode.

16. The integrated circuit device of claim 15, wherein the second width is smaller than the first width.

17. The integrated circuit device of claim 15, wherein the hydrogen atomic layer comprises at least one of a protium atom ($^1$H) and a deuterium atom ($^2$H).

18. The integrated circuit device of claim 15, wherein a first difference between a bottom portion width and a top portion width of the first channel region is smaller than a second difference between a bottom portion width and a top portion width of the second channel region.

19. The integrated circuit device of claim 15, wherein a roughness of a first surface of the first channel region is lower than a roughness of a second surface of the second channel region.

20. The integrated circuit device of claim 15, wherein the first gate insulation layer comprises a first lower gate insulation layer, a first interface layer, and a first high-k dielectric layer stacked on the hydrogen atomic layer in this stated order, and
wherein the second gate insulation layer comprises a second lower gate insulation layer, a second interface layer, and a second high-k dielectric layer stacked on the second channel region in this stated order.

* * * * *